(12) United States Patent
Honda

(10) Patent No.: US 6,475,821 B2
(45) Date of Patent: Nov. 5, 2002

(54) CIRCUIT SUBSTRATE, DETECTOR, AND METHOD OF MANUFACTURING THE SAME

(75) Inventor: Nobuaki Honda, Tokyo (JP)

(73) Assignee: Yamatake Corporation, Tokyo (JP)

( * ) Notice: Subject to any disclaimer, the term of this patent is extended or adjusted under 35 U.S.C. 154(b) by 0 days.

(21) Appl. No.: 09/995,392

(22) Filed: Nov. 26, 2001

(65) Prior Publication Data

US 2002/0074615 A1 Jun. 20, 2002

Related U.S. Application Data

(62) Division of application No. 09/390,921, filed on Sep. 7, 1999, now Pat. No. 6,353,262.

(30) Foreign Application Priority Data

Apr. 3, 1997 (JP) .................................. 9-85059
Apr. 3, 1998 (WO) ................................ PCT/JP98/01540

(51) Int. Cl.[7] .......................................... H01L 21/302
(52) U.S. Cl. ......................... 438/48; 438/50; 438/697; 216/2
(58) Field of Search .............................. 438/48, 57, 49, 438/50, 51, 52, 53, 54, 667, 689, 691, 692, 696, 697, 770, 787, 791, 778, 700; 216/2; 257/773, 415; 73/514.11, 700

(56) References Cited

U.S. PATENT DOCUMENTS

| | | | | |
|---|---|---|---|---|
| 3,623,961 A | * | 11/1971 | Jokabus et al. | 204/15 |
| 4,823,181 A | * | 4/1989 | Mohsen et al. | 357/51 |
| 5,073,815 A | * | 12/1991 | Kosaka et al. | 257/508 |
| 5,494,832 A | * | 2/1996 | Lehmann et al. | |
| 5,510,655 A | * | 4/1996 | Tanielian | 257/774 |
| 5,576,250 A | * | 11/1996 | Diem et al. | |
| 5,646,072 A | * | 7/1997 | Maudi et al. | |
| 5,721,162 A | * | 2/1998 | Schubert et al. | |
| 6,037,088 A | * | 3/2000 | Morikawaet | 136/259 |
| 6,059,981 A | * | 5/2000 | Nakasuji | 216/2 |
| 6,090,636 A | * | 7/2000 | Geusic et al. | 438/106 |
| 6,103,545 A | * | 8/2000 | Fedeli | 438/53 |
| 6,143,190 A | * | 11/2000 | Yagi et al. | 216/27 |
| 6,150,280 A | * | 11/2000 | Yamshita | 438/707 |
| 6,287,885 B1 | * | 9/2001 | Muto et al. | 438/48 |

FOREIGN PATENT DOCUMENTS

| | | | |
|---|---|---|---|
| JP | 7-14874 | | 1/1975 |
| JP | 54-55181 | | 5/1979 |
| JP | 359076465 | * | 5/1984 |
| JP | 2-239625 | | 9/1990 |
| JP | 2-259527 | | 10/1990 |
| JP | 4-199626 | | 7/1992 |
| JP | 63283063 A | * | 11/1998 |

* cited by examiner

Primary Examiner—Savitri Mulpuri
(74) Attorney, Agent, or Firm—Blakely Sokoloff Taylor & Zafman

(57) ABSTRACT

A cylindrical, electrical insulating region is formed in a circuit substrate made of a semiconductor substrate to continuously extend from the upper surface to the lower surface of the semiconductor substrate and be closed in a plane parallel to the surface of the semiconductor substrate. The electrical insulating region is formed by an insulating region made of a heat-resistant insulating material. The insulating region is formed by forming a through hole or trench in the circuit substrate and forming an oxide film or nitride film on the wall surface of the hole or trench or filling it with an insulating material. When the trench is formed, the substrate is thinned by polishing or the like until the trench appears on the upper and lower surfaces of the substrate after the insulating region is formed. The region surrounded by the insulating region functions as an electrode when the conductivity of the region is increased by diffusing an impurity in it.

13 Claims, 28 Drawing Sheets

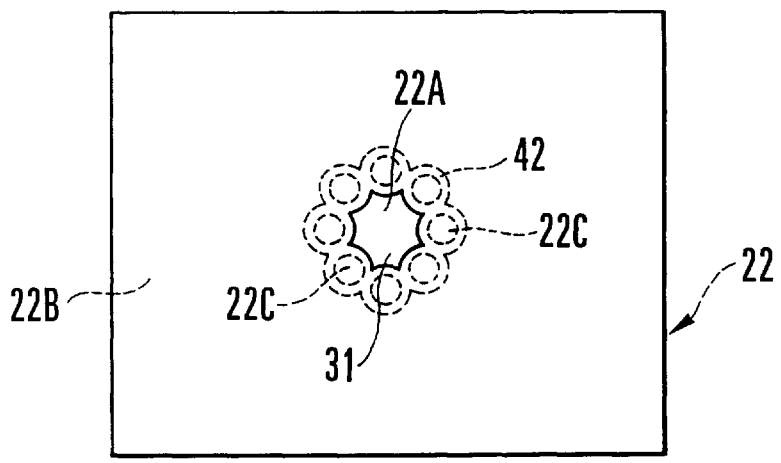
F I G. 11A
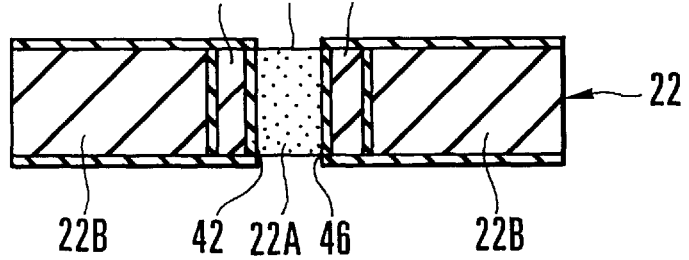
F I G. 11B
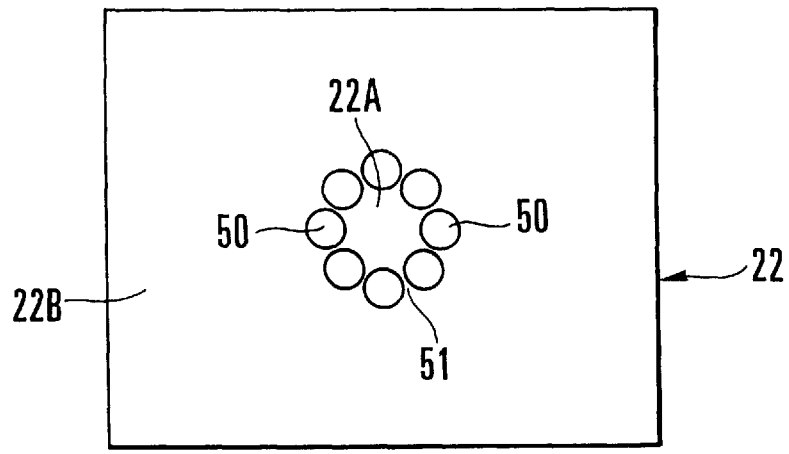
F I G. 12A
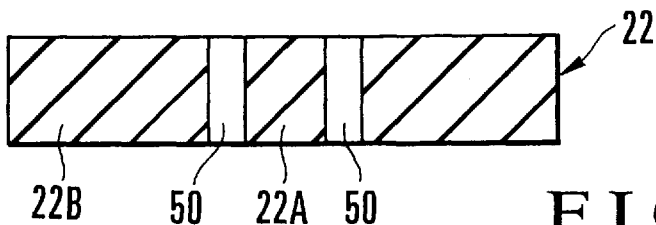
F I G. 12B

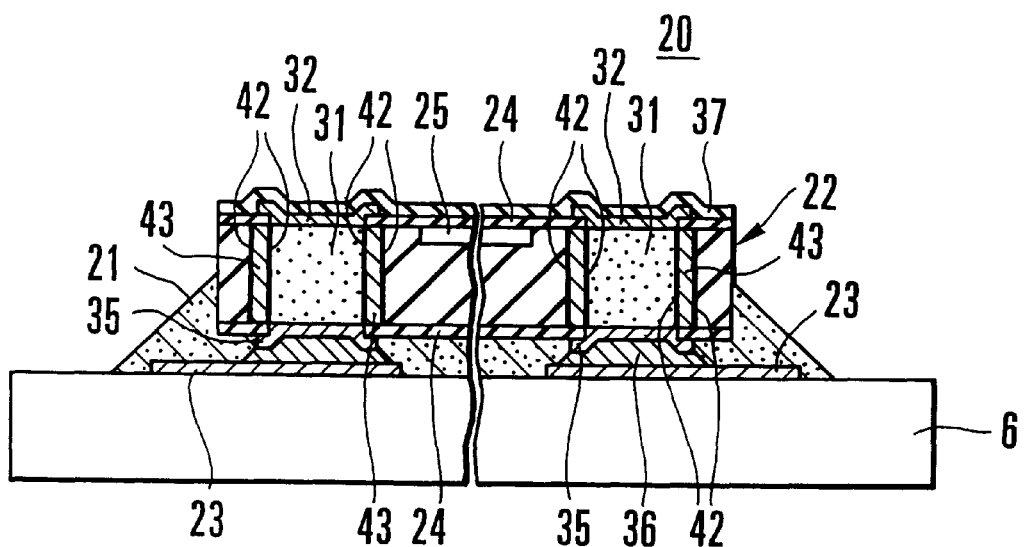
F I G. 19
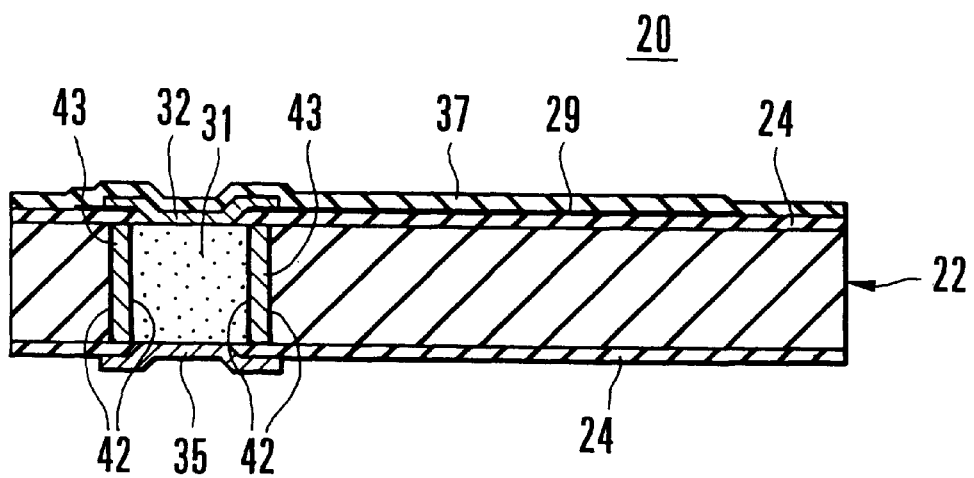
F I G. 20

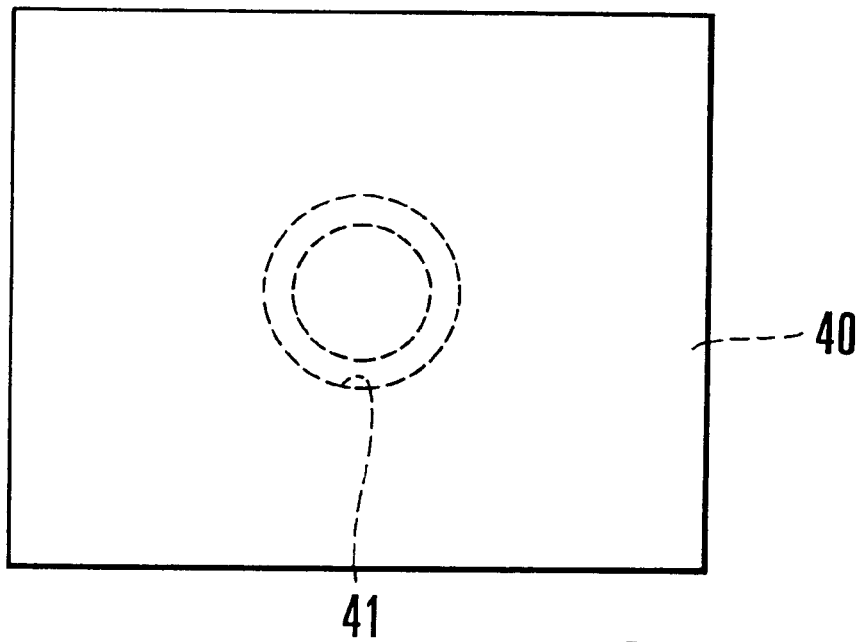
F I G. 23A
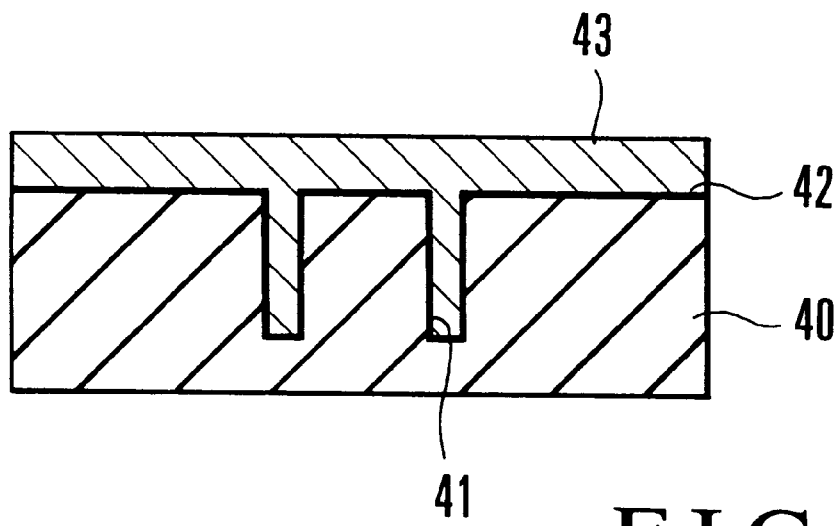
F I G. 23B

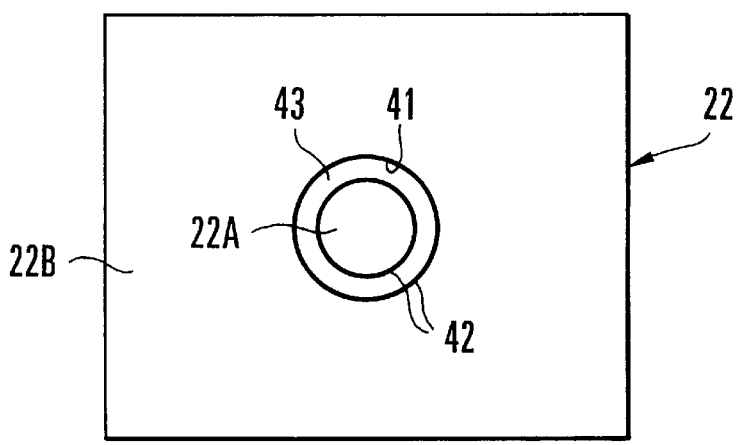
F I G. 24A
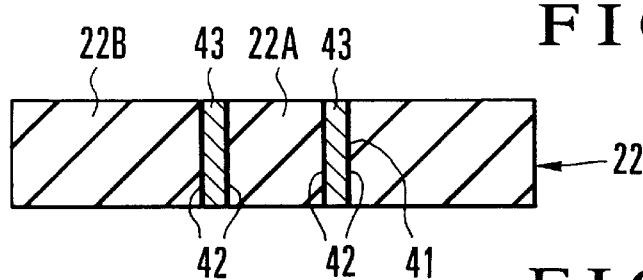
F I G. 24B
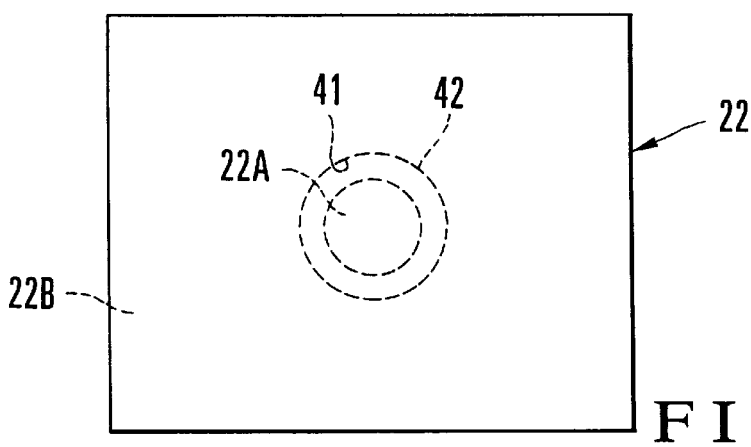
F I G. 25A
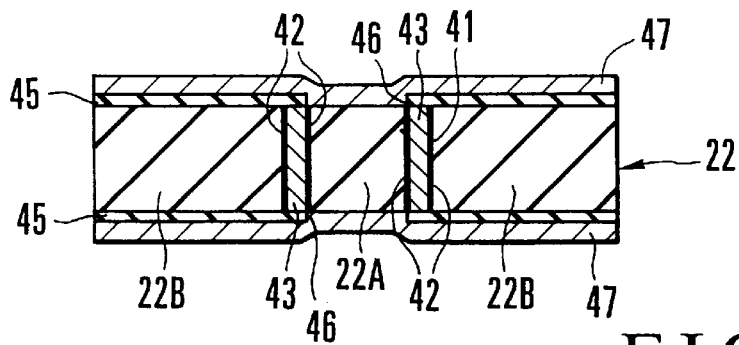
F I G. 25B

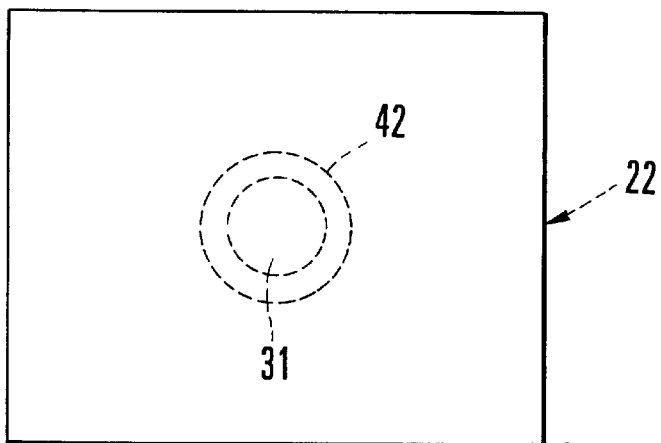
F I G. 26A
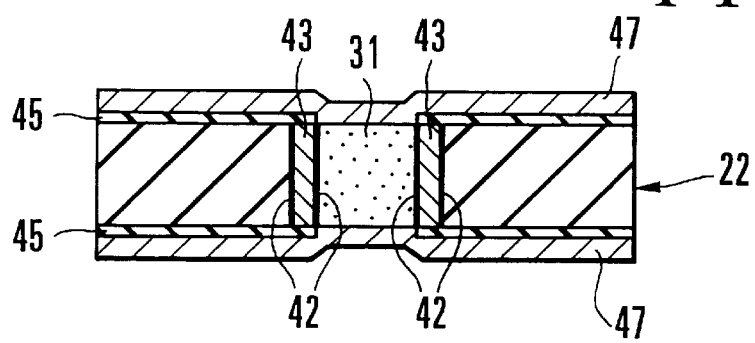
F I G. 26B
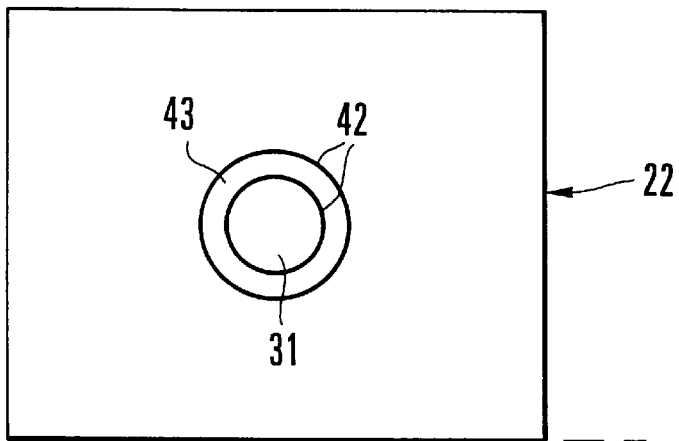
F I G. 27A
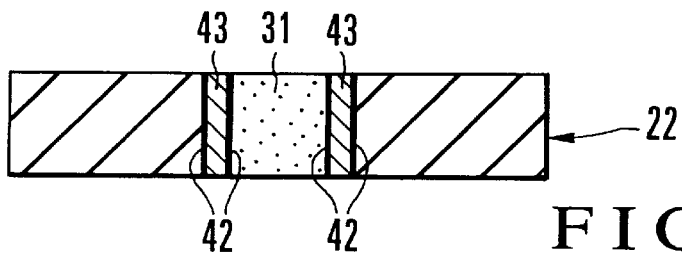
F I G. 27B

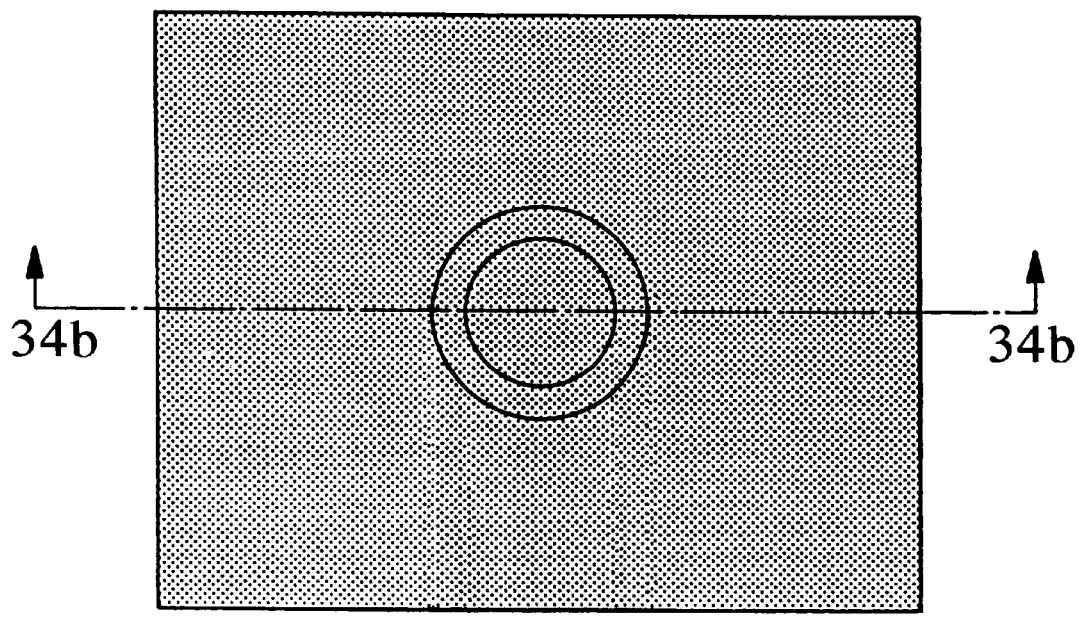
F I G. 34a
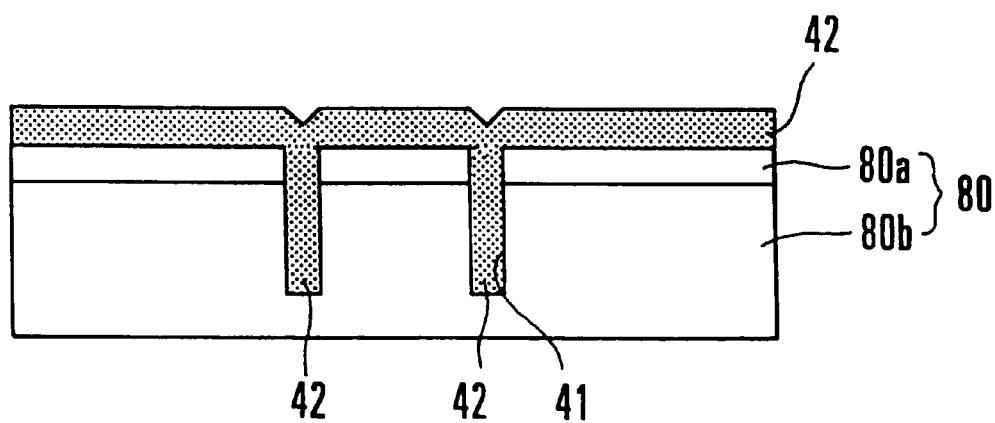
F I G. 34b

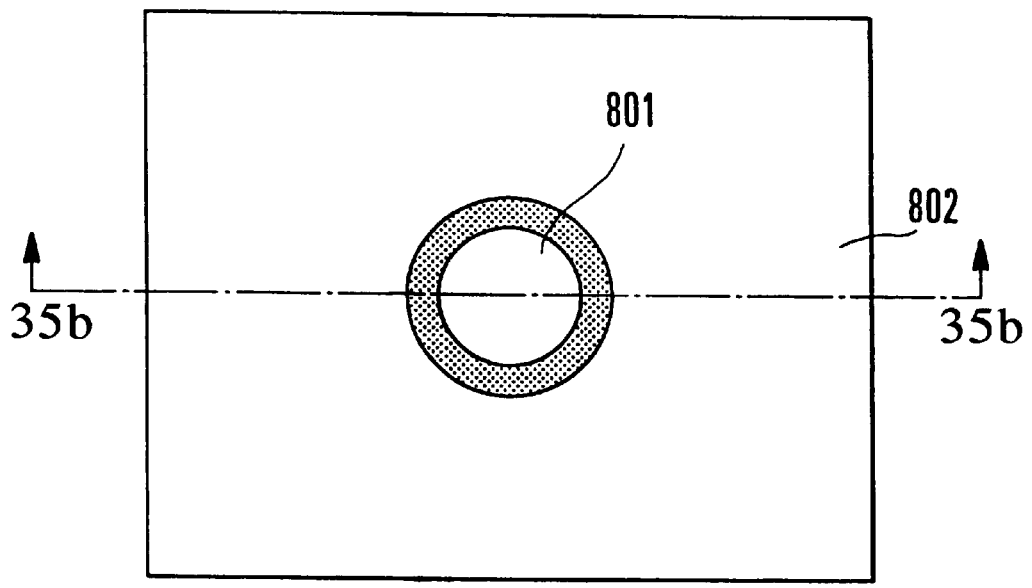
F I G. 35a
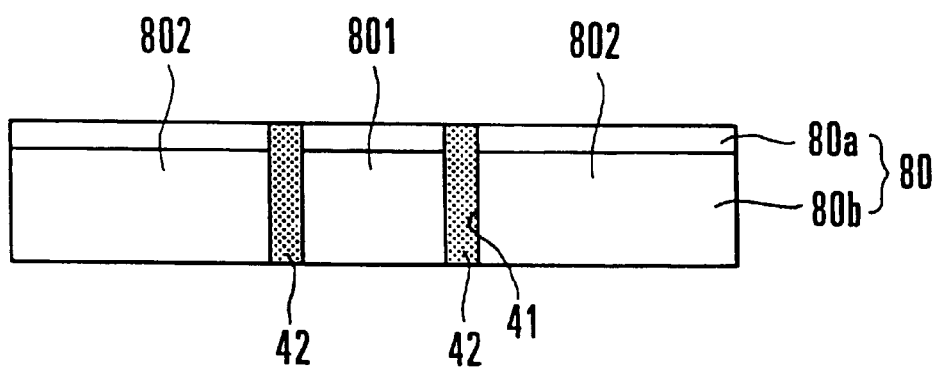
F I G. 35b

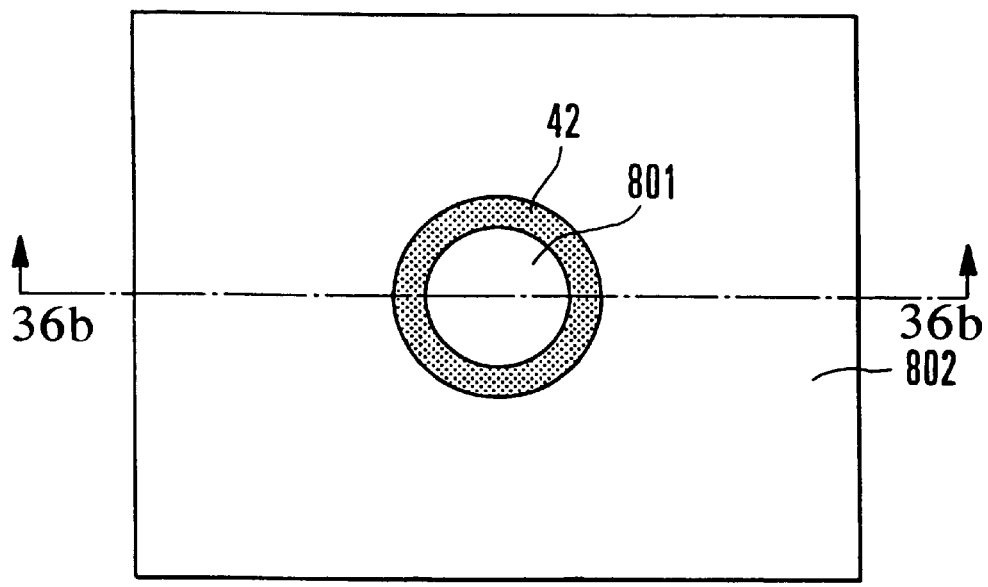
F I G. 36a
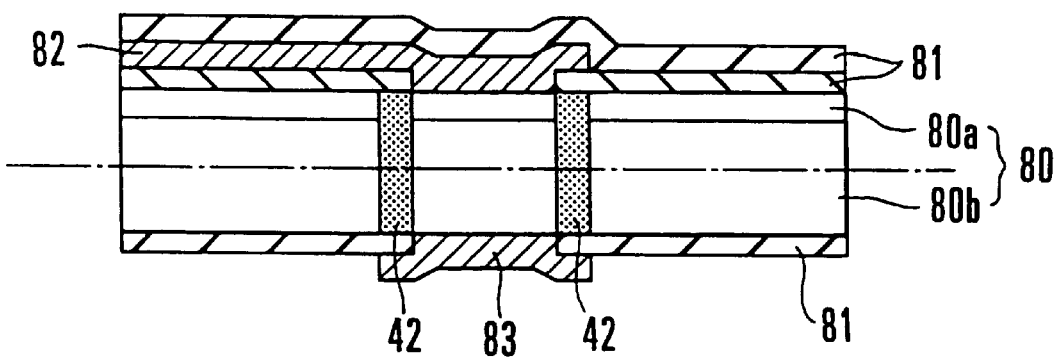
F I G. 36b

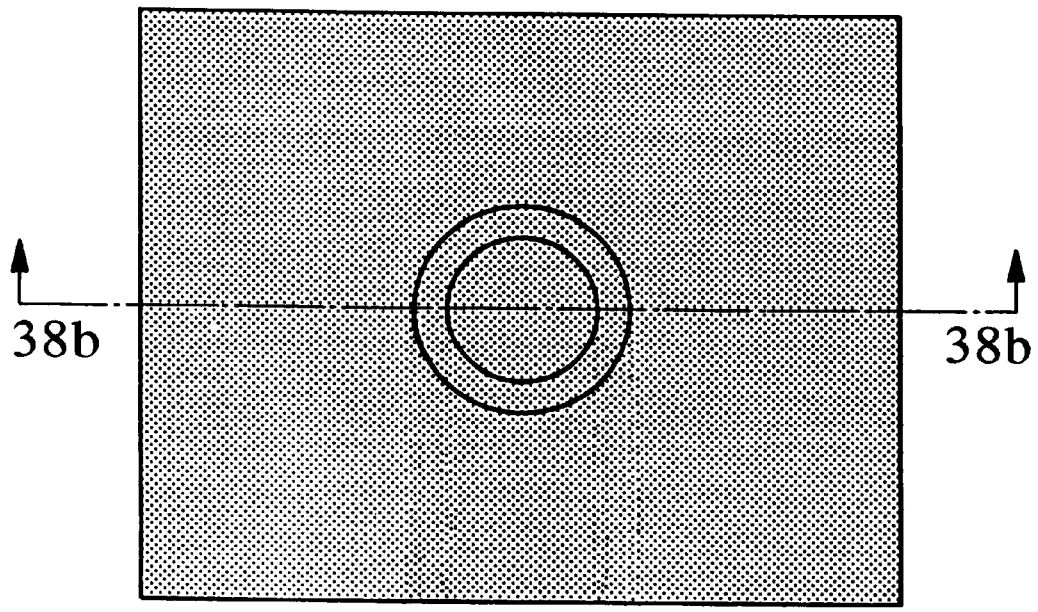
F I G. 38a
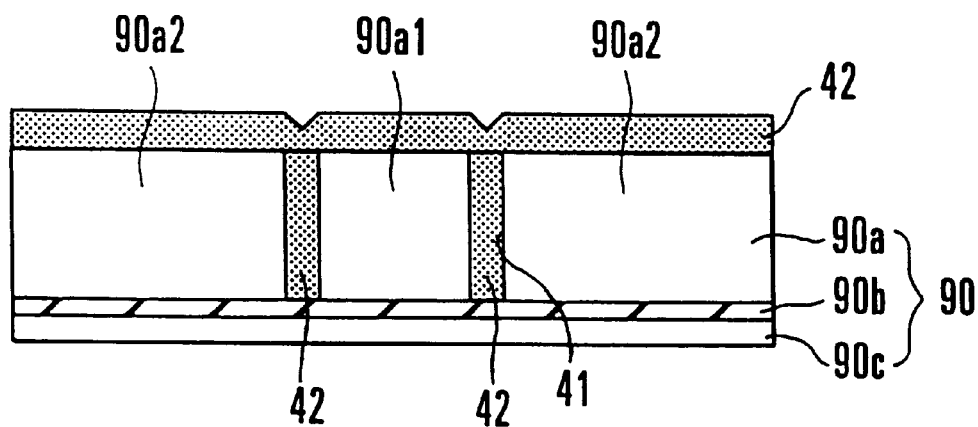
F I G. 38b

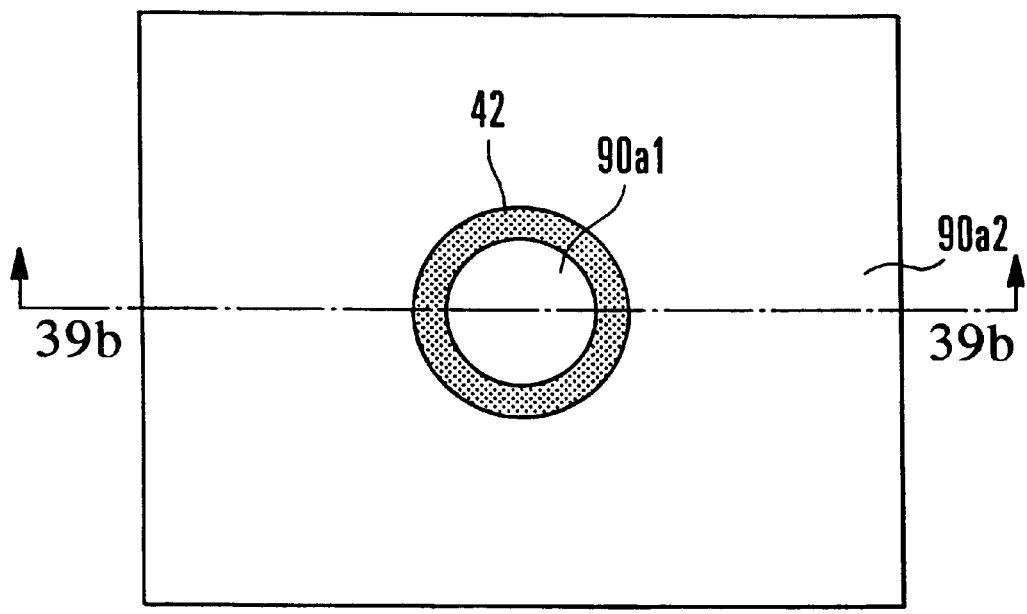
F I G. 39a
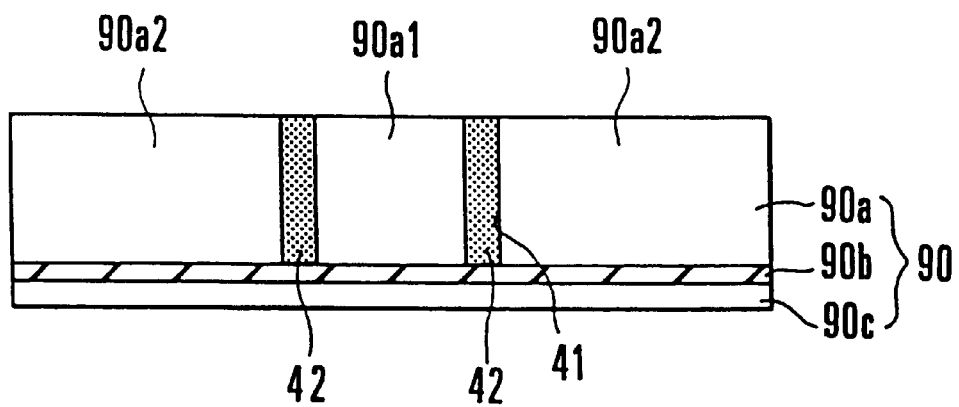
F I G. 39b

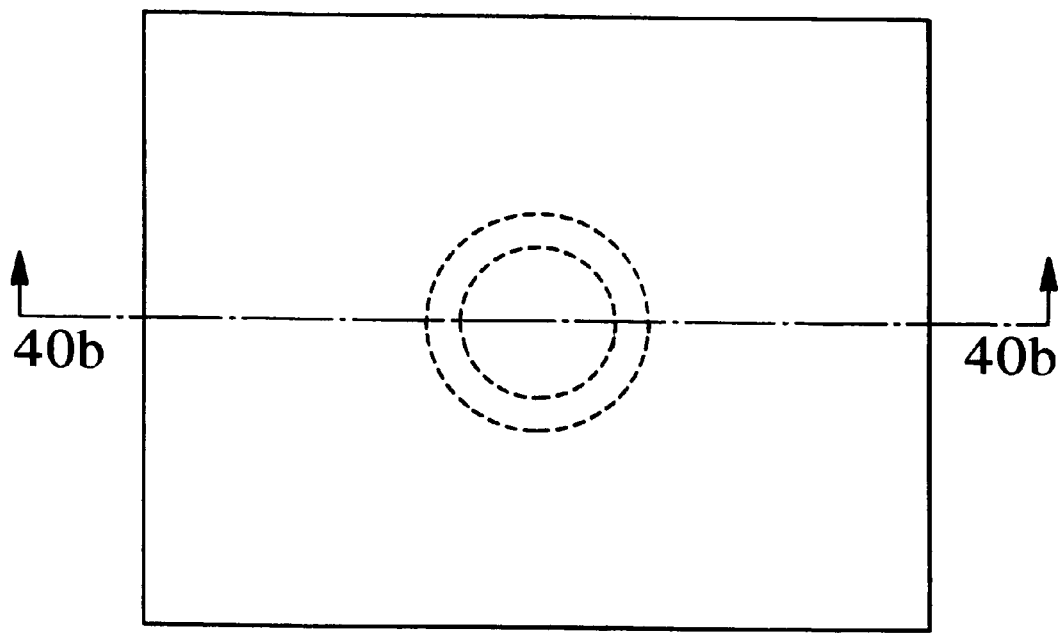
F I G. 40a
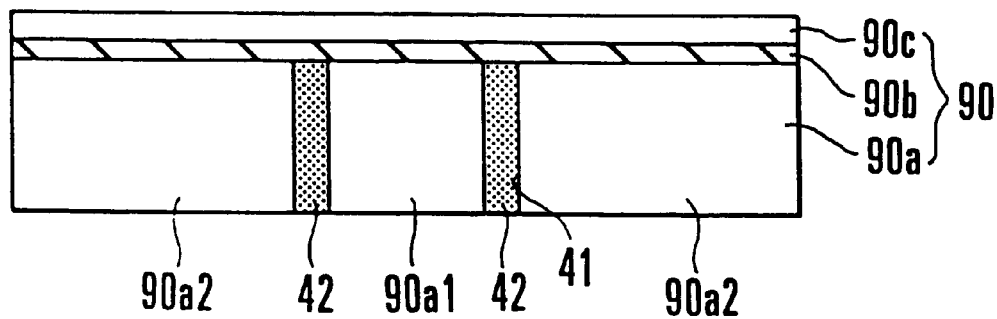
F I G. 40b

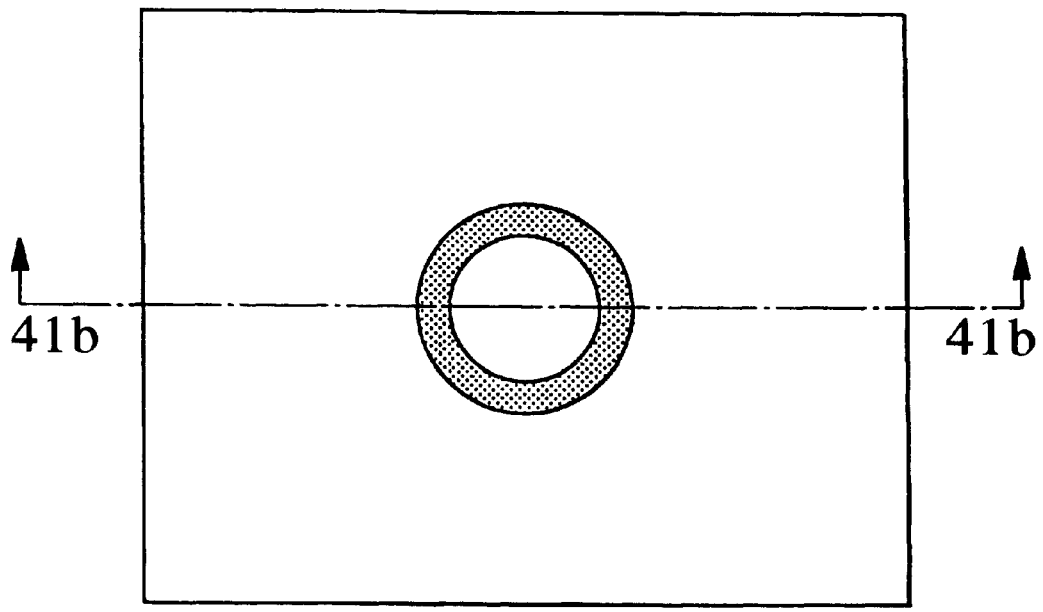
F I G. 41a
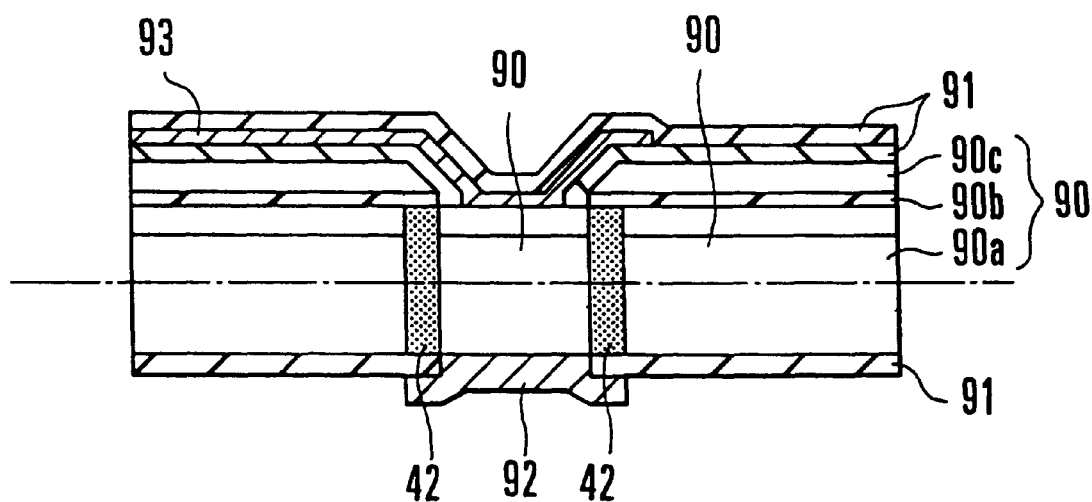
F I G. 41b

CIRCUIT SUBSTRATE, DETECTOR, AND METHOD OF MANUFACTURING THE SAME

This is a divisional application of Ser. No. 09/390,921 filed Sep. 7, 1999 U.S. Pat. No. 6,353,262.

1. TECHNICAL FIELD

The present invention relates to a circuit substrate, a detector using the circuit substrate, and a method of manufacturing the same and, more particularly, to a circuit substrate having electrodes exposed also on the lower surface side of the substrate.

2. BACKGROUND ART

Assume that a technique of connecting the electrodes formed on a semiconductor substrate to an external device by using bonding wires is applied to a detector having a detecting section formed on a substrate surface to detect the flow rate and velocity of a fluid (e.g., Japanese Patent Publication No. 6-25684). In this case, the wires disturb the flow of a fluid, adversely affecting measurement. In addition, the wires hinder a plurality of semiconductor substrates from being stacked into one semiconductor device. Furthermore, since the electrode extraction portions are exposed on the substrate surface, the electrode portions may undergo electrolytic corrosion.

Conventionally, as techniques of connecting the electrodes formed on a semiconductor substrate to an external device without using any bonding wire, the following techniques are known:

① lower-surface electrode extraction technique (Japanese Patent Laid-Open No. 7-14874);

② lower-surface electrode extraction technique using anisotropic etching technique; and ③ electrode extraction technique using deep etching technique.

According to lower-surface electrode extraction technique (Japanese Patent Laid-Open No. 7-14874) ①, an electrode extraction structure is designed such that a through hole is formed in a semiconductor substrate, and a conductive layer (pad) connected to part of an internal circuit is formed in the hole to be exposed on the substrate surface. This hole is formed as follows. First, oxide films are formed on the upper and lower surfaces of the semiconductor substrate. Windows are then formed in the oxide films on the upper and lower surfaces. Silicon etching is performed from the upper and lower surface sides by using the oxide films as masks.

In the structure of such an electrode extraction portion, each pad portion is exposed on both the upper and lower surfaces of the substrate. For this reason, when a semiconductor chip is to be mounted by wire bonding, the upper surface side of each pad portion can be used as an electrode extraction portion. When this process is to be performed by a bump method, the lower surface side of each pad portion can be used as an electrode extraction portion.

In lower-surface electrode extraction technique ①, however, after a hole is formed, a metal is embedded in the hole to form a conductive layer. If this conductive layer is formed before other IC manufacturing processes, a high-temperature process cannot be performed because the metal of the conductive layer causes contamination.

Assume that the substrate is not an insulator. In this case, to form a hole in the substrate after an IC manufacturing process or the like, a conductive portion penetrating through the substrate must be isolated from the substrate itself by an insulator. If, for example, the substrate is made of silicon, the optimal insulator is a thermal oxide film. However, a high temperature is required for a growth process of this thermal oxide film. It is therefore difficult to form holes after the process of forming an IC or the like.

In general, the interconnections on a substrate are located on insulating films such as oxide and nitride films. To cause a conductive layer penetrating through the substrate to come into contact with the interconnections, these oxide films must be selectively etched through deep holes. In this case, if both the insulating film used to insulate the substrate from a conductive portion and the insulating film having interconnections formed thereon are oxide films, it is very difficult to selectively etch these insulating films.

According to the structure of a lower-surface electrode extraction portion based on technique using anisotropic etching ②, as shown in FIGS. 42A to 42D, since a semiconductor substrate 1 is etched by the anisotropic etching technique, the area of an electrode extraction portion 10 on the lower surface is several times larger than the contact area on the upper surface of the substrate. For this reason, when a small device or a device having many electrodes is to be manufactured, in particular, since the area of each electrode extraction portion on the lower surface becomes large, the device area becomes large. This technique is not therefore practical.

In addition, in the structure of this electrode extraction portion, a metallized layer 12 may be formed from the lower surface side while a membrane 11 is left on the upper surface. In this case, if a process on the upper surface side is performed after metallizing and soldering processes (or other processes such as a plating process), the problem of contamination in a heating process or the like is posed. If metallizing is performed in the last step in the manufacturing process, it is very difficult to keep the membrane 11 intact in the preceding steps in the process. For this reason, a general process cannot be used, and hence this technique cannot be used in practice. Reference numeral 13 denotes a solder; 14, a upper-surface electrode interconnection; and 15, a protective film.

According to the structure of an electrode extraction portion based on technique using deep etching ③, as shown in FIGS. 43A to 43D, since a hole 16 having a substantially constant diameter can be formed in a semiconductor substrate 1, the problem of a device size in anisotropic etching in FIG. 42D can be solved. However, the problems of contamination in a heating process and breakdown of a membrane 11 remain unsolved. In addition, this method must deal with the problem of how to form a contact window 17 in an insulating layer 3 without etching the wall of the hole. In general, a thermal oxide film 18 is an optimal film to be formed on the wall of a hole. However, the insulating layer 3 on the upper surface is often an oxide film. In this case, no problem is posed if the side surface of the hole can be covered with a resist in a photolithography process. It is, however, very difficult to apply photolithography to the almost vertical wall of the hole having such a large aspect ratio.

3. DISCLOSURE OF THE INVENTION

Problem to be Solved by the Invention

The present invention has been made to solve the above problems in the prior arts, and has its object to provide a circuit substrate and a detector in which electrodes are formed in the thickness direction of a substrate to allow connection of the electrodes from the lower surface side of the substrate while the problems of contamination, breakdown of membranes, and the like are solved altogether.

Means of Solution to the Problem

In order to achieve the above object, according to the present invention, there is provided a circuit substrate characterized by comprising an electrical insulating region which is formed on a semiconductor substrate, made of a heat-resistant insulating material, continuously extends from an upper surface to lower surface of the semiconductor substrate, and is closed in a plane parallel to the surface of the semiconductor substrate, wherein the electrical insulating region separates the semiconductor substrate into first and second electrically insulated/isolated regions, the first region is surrounded by the electrical insulating region, the second region is located outside the electrical insulating region, and the first region has a high impurity concentration to have conductivity.

In addition, according to the present invention, there is provided a circuit substrate characterized by comprising an electrical insulating region which is formed on a semiconductor substrate of the same conductivity type with different impurity concentrations in a thickness direction, made of a heat-resistant insulating material, continuously extends from an upper surface to lower surface of the semiconductor substrate, and is closed in a plane parallel to the surface of the semiconductor substrate, wherein the electrical insulating region separates the semiconductor substrate into first and second electrically insulated/isolated regions, the first region is surrounded by the electrical insulating region, the second region is located outside the electrical insulating region, and the first region has a high impurity concentration to have conductivity.

In addition, according to the present invention, there is provided a circuit substrate manufacturing method characterized by comprising the steps of: forming, on a semiconductor substrate, an electrical insulating region which is made of a heat-resistant insulating material, continuously extends from an upper surface to a lower surface of the semiconductor substrate, and is closed in a plane parallel to the surface of the semiconductor substrate, and separating the semiconductor substrate into first and second electrically insulated/isolated regions, the first region being surrounded by the electrical insulating region and the second region being outside the electrical insulating region; and diffusing an impurity into the first region, of the semiconductor substrate, which is surrounded by the electrical insulating region to make the first region have conductivity.

Effect

As has been described above, according to the present invention, since the inside of a substrate having conductivity is separated into electrically insulated/isolated regions by a heat-resistant insulating material, a conductive region surrounded by the electrical insulating region can be used as an electrode. This electrode can be extracted from the lower surface side. Therefore, no wire bonding is required.

Since each electrode is formed by impurity diffusion, no electrode material needs to be embedded in the substrate. In addition, the above electrode is formed before the formation of the membrane and the like. This solves the problems of contamination, breakdown of a membrane, and the like in the IC manufacturing process.

In addition, according to the present invention, since the electrical insulating regions are formed on the semiconductor substrate having different impurity concentration distributions in the thickness direction, a lower-surface extraction electrode can be formed by less impurity diffusion. Furthermore, an IC and the like can be formed on the side of the substrate which has a lower impurity concentration.

4. BRIEF DESCRIPTION OF THE DRAWINGS

FIGS. 11A to 15B are views for explaining a method of manufacturing a circuit substrate and electrode according to the second embodiment of the present invention (in which FIGS. 11A, 12A, 13A, 14A, and 15A are plan views, and FIGS. 11B, 12B, 13B, 14B, and 15B are sectional views):

FIGS. 19 and 20 are sectional views showing a detector according to the fifth embodiment of the present invention;

FIGS. 21A to 27B are views for explaining a method of manufacturing a circuit substrate and electrode according to the fifth embodiment of the present invention (in which FIGS. 21A, 22A, 23A, 24A, 25A, 26A, and 27A are plan views, and FIGS. 21B, 22B, 23B, 24B, 25B, 26B, and 27B are sectional views):

FIGS. 33 to 36 are views for explaining a method of manufacturing a circuit substrate and electrode according to the 10th embodiment of the present invention;

FIGS. 37 to 41B are views for explaining a method of manufacturing a circuit substrate and electrode according to the 11th embodiment of the present invention;

FIGS. 42A to 43D are views for explaining a conventional electrode manufacturing method; and FIGS. 43A to 43D are views for explaining another conventional electrode manufacturing method.

5. BEST MODE OF CARRYING OUT THE INVENTION

Embodiments of the present invention will be described in detail below with reference to the accompanying drawings.

First Embodiment

Figure 1:
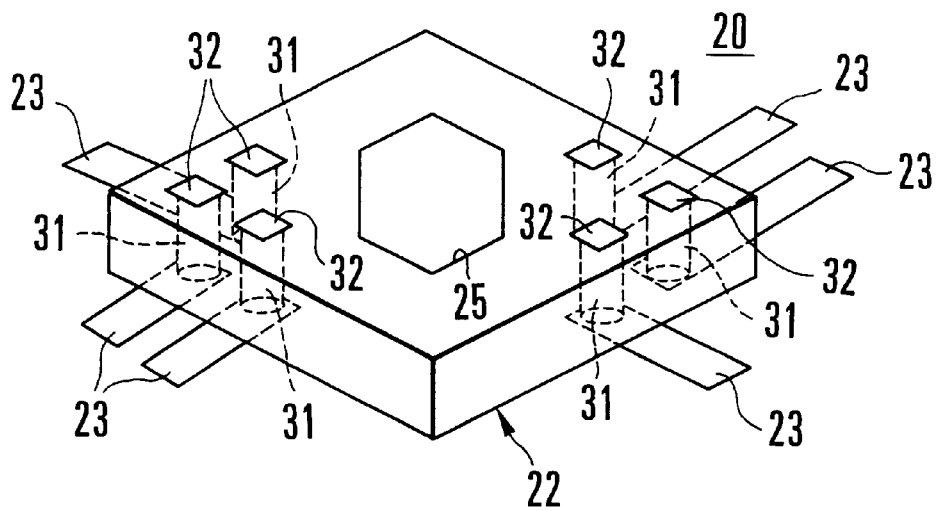
FIG. 1 is a perspective view of a detector using a circuit substrate according to the first embodiment of the present invention.
Figure 2:
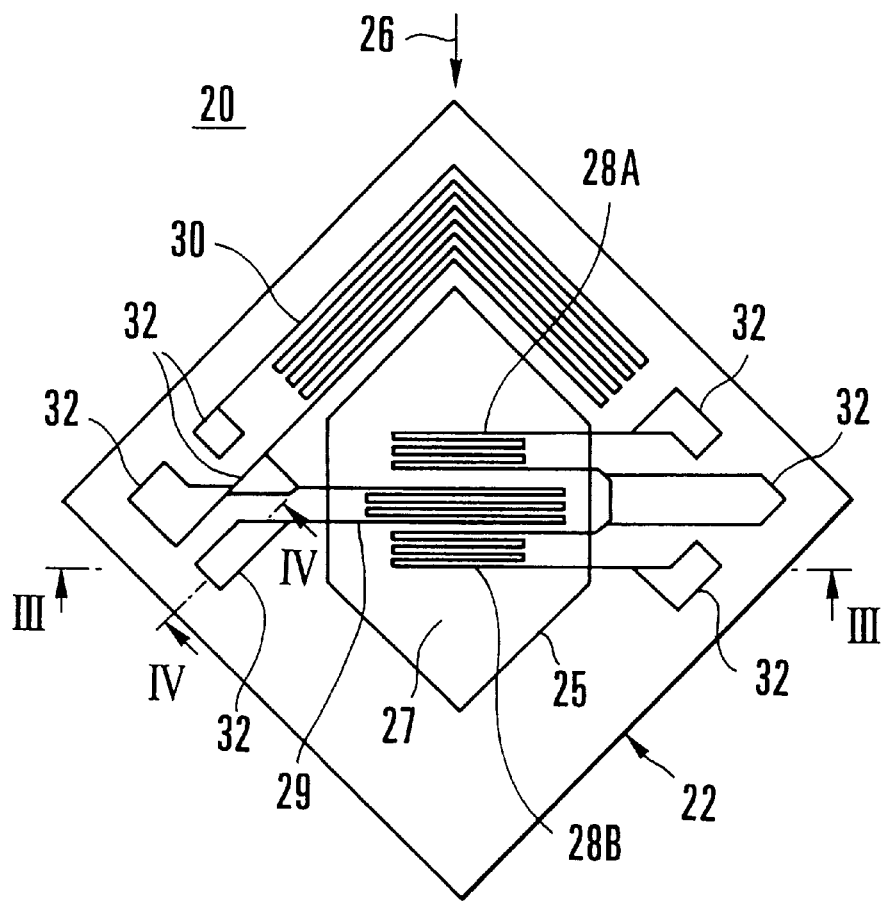
FIG. 2 is a plan view of the detector.
Figure 3:
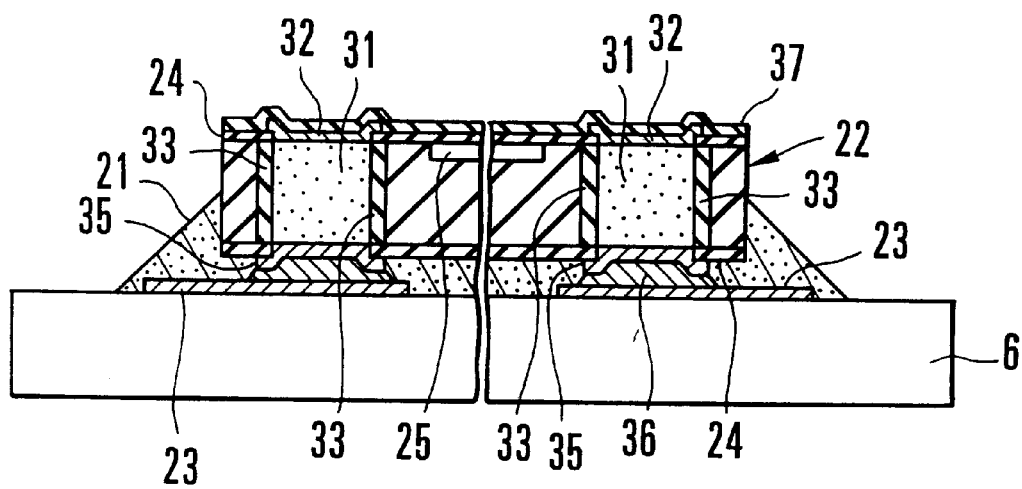
FIG. 3 is a sectional view taken along a line III—III in FIG. 2.
Figure 4:
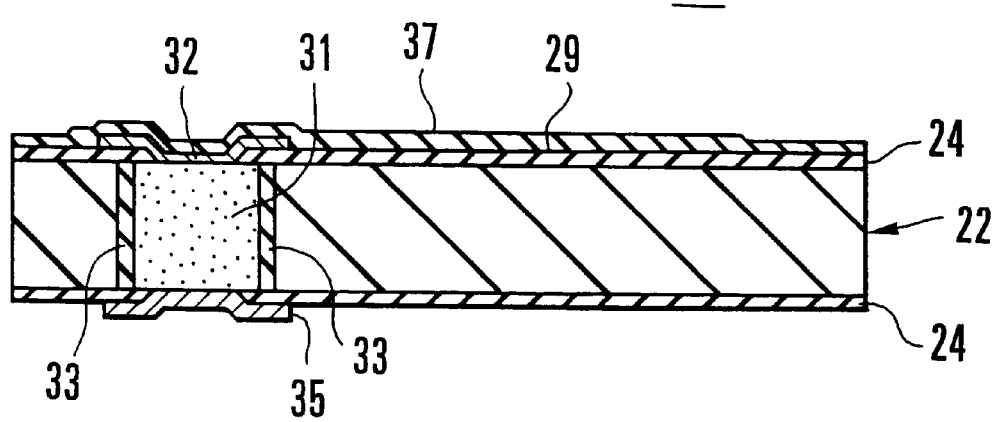
FIG. 4 is an enlarged sectional view taken along a line IV—IV in FIG. 2.

In the first embodiment, the present invention is applied to a flow rate detector (flow rate sensor). FIG. 1 is a perspective view of the detector (sensor) according to the first embodiment. FIG. 2 is a plan view of the sensor. FIG. 3 is a sectional view taken along a line III—III in FIG. 2. FIG. 4 is an enlarged sectional view taken along a line IV—IV in FIG. 2.

A flow rate sensor 20 detects the flow rate of a fluid from a change in resistivity with a change in fluid temperature. The flow rate sensor 20 has a detecting section formed on a circuit substrate 22, as shown in FIG. 2.

The circuit substrate 22 is fixed/mounted on a mount board 6 with a silicone resin 21 and a solder 36.

The mount board 6 is made of an insulating material such as a ceramic material. A plurality of mount-board electrodes 23 are formed in the center of the mount board 6, on which the circuit substrate 22 is mounted, by a known screen printing technique.

This circuit substrate 22 is made of an n-type silicon substrate material or a low-conductivity p-type silicon substrate material having an impurity concentration of $4 \times 10^{19}$ cm$^{-3}$ or less.

The upper and lower surfaces of the circuit substrate 22 are covered with insulating layers 24 such as oxide or nitride films. A membrane (diaphragm) 25 is formed in a central portion of the upper surface of the circuit substrate 22 by etching from the upper surface side. A detecting section 27 for detecting the flow rate of a fluid 26 to be measured is formed at the center of the diaphragm 25 by a known thin film formation technique.

The detecting section 27 includes temperature-measuring resistors 28A and 28B opposing each other through a predetermined gap in the flowing direction of the fluid 26 and having resistivities which change with changes in temperatures, and a heater 29 placed between the temperature-measuring resistors 28A and 28B. A fluid temperature detecting resistor 30 for measuring the temperature of the fluid 26 is formed outside the diaphragm 25 on the upstream side of the fluid 26. The two ends of each of the temperature-measuring resistors 28A and 28B, the heater 29, and the fluid temperature detecting resistor 30 are electrically connected to electrodes 31 formed in the circuit substrate 22 at positions around the diaphragm 25 through thin metal contact films 32. The temperature-measuring resistors 28A and 28B constitute a bridge circuit.

Each electrode 31 extends from the upper surface to the lower surface of the circuit substrate 22 in the thickness direction of the substrate. The electrode 31 is surrounded by an electrical insulating region 33 to be electrical isolated from the substrate material outside the insulating region 33. This electrode 31 can be easily formed by diffusing an impurity into the region surrounded by the insulating region 33 to cause the region to have a higher impurity concentration than the region outside the insulating region 33 so as to have conductivity. As a diffusion source for diffusion, Al or the like is used. The above insulating region 33 is formed into a cylindrical shape by using a heat-resistant insulating material, e.g., a reaction product produced when a substrate material reacts, and more specifically, an oxide ($SiO_2$) or nitride ($Si_3N_4$) of a substrate material, an $SiN_x$—, $Al_2O_3$—, or Si—B—O-based glass material, or the like. The two ends of the insulating region 33 are exposed on the upper and lower surface of the substrate to completely surround the electrode 31 to electrically insulate it from the substrate material outside the insulating region 33.

Such an electrical insulating region 33 can be easily formed by forming a through hole or trench in the circuit substrate 22, forming, on the wall surface of the hole or trench, a reaction product (oxide or nitride film) produced when the substrate material reacts, or filling the hole or trench with a fine powder of $SiN_x$—, $Al_2O_3$—, or Si—B—O-based glass or the like and sintering it, as will be described later.

Assume that a trench is formed. In this case, after the insulating region 33 is formed on the trench wall surface, the substrate may be thinned by polishing or the like to cause the trench to appear on the upper and lower surfaces of the substrate, thereby exposing the two ends of the insulating region 33 on the upper and lower surfaces of the substrate.

An impurity is diffused into the region surrounded by the electrical insulating region, of the insulated/isolated region, to increase the conductivity. As a result, this region serves as the electrode 31. There is therefore no need to embed a metal material into the substrate to form an electrode. The electrode formed by the diffusion of the impurity is exposed on the upper and lower surfaces of the semiconductor substrate to allow electric connection from the lower surface side.

The thin metal contact film 32 and a lower-surface electrode pad 35 are respectively connected to the two surfaces of the electrode 31, i.e., the surfaces exposed on the upper and lower surfaces of the circuit substrate 22. The lower-surface electrode pad 35 is electrically and mechanically connected to the mount-board electrode 23 formed on the mount board 6 with a solder 36. The entire upper surface of the circuit substrate 22 is covered with a protective layer 37 for preventing electrolytic corrosion of each electrode portion by improving its environment resistance.

In the flow rate sensor 20 having the above structure, when the fluid 26 flows while the heater 29 is generating heat upon energization of the detecting section 27, the temperature-measuring resistor 28A located on the upstream side is cooled by the fluid 26. Meanwhile, the temperature-measuring resistor 28B located on the downstream side is heated when the fluid 26 heated by the heater 29 passes by. A temperature difference appears between the temperature-measuring resistors 28A and 28B. This temperature difference is obtained as a change in resistance. By detecting this change in resistance, the flow velocity and rate of the fluid 26 can be obtained. The fluid temperature detecting resistor 30 is used to compensate for a change in the temperature of the circuit substrate 22 due to an ambient temperature.

A method of manufacturing the above circuit substrate 22 and the electrodes 31 will be described next.

FIGS. 5A to 10B are plan and sectional views showing the first method of manufacturing the circuit substrates and the electrodes.

Figure 5A:
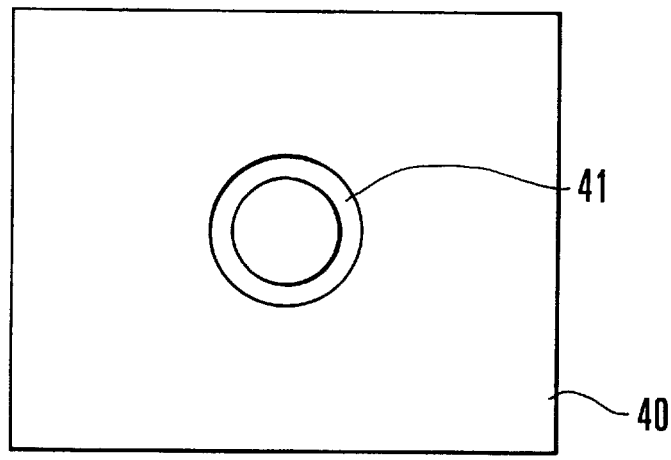
FIGS. 5A to 10B are views for explaining a method of manufacturing a circuit substrate and electrode according to the first embodiment of the present invention (in which FIGS. 5A, 6A, 7A, 8A, 9A, and 10A are plan views, and FIGS. 5B, 6B, 7B, 8B, 9B, and 10B are sectional views)
Figure 5B:
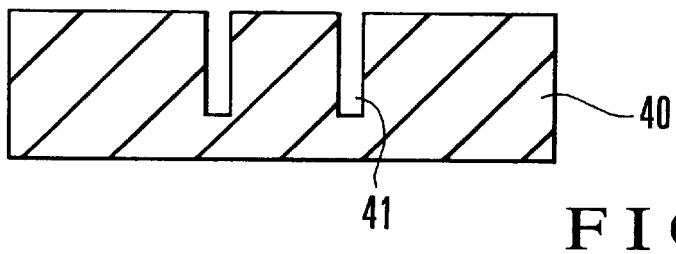

First of all, a semiconductor substrate thicker than the circuit substrate 22 is prepared as a starting substrate 40. Prospective electrode formation portions of the starting substrate 40 are etched to form cylindrical trenches 41. The starting substrate 40 preferably has a thickness enough to maintain sufficient mechanical strength upon formation of the trenches 41. The depth of each trench 41 is set to be slightly larger than the thickness of the finished circuit substrate 22. In addition, the trenches 41 need not be vertical. If, for example, a silicon substrate is used as a substrate material, substantially vertical trenches 41 can be formed, as shown in FIG. 5B, by using a low-temperature Si dry etching apparatus or the like. In this case, since the aspect ratio of a cross-section of the trench 41 can be set to about 20:1, when a 500-μm deep trench is to be formed, a trench having a width of at least 25 μm needs to be formed.

Figure 6A:
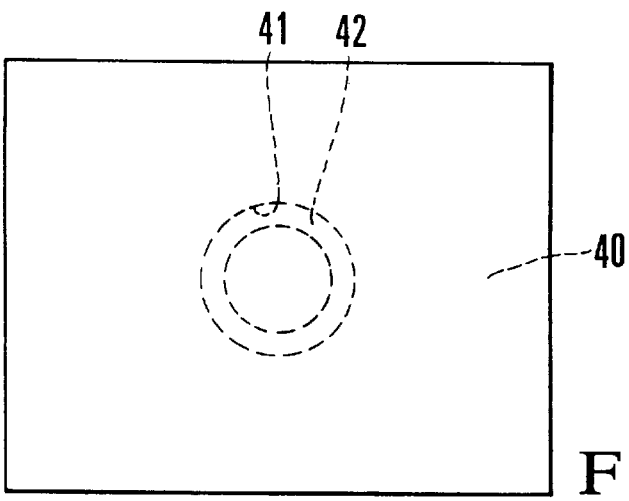
Figure 6B:
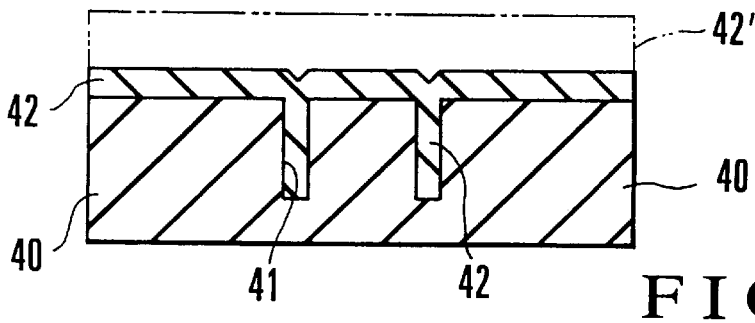

An insulating layer 42 made of SiO$_2$ is formed on the surface of the starting substrate 40 and the trench walls of the trenches 41 (FIGS. 6A and 6B). If the substrate is made of Si, the insulating layer 42 is preferably formed by using an apparatus having the property of satisfactorily spreading a film on the entire surface of the substrate at a high film formation rate, e.g., a TEOS-CVD (Chemical Vapor Deposition) apparatus. This film need not be perfectly formed. Even if a space is left in a trench, no problem is posed as long as the finished electrode formation portion on the substrate has sufficient electrical insulating properties and sufficient mechanical strength. In the case of the Si substrate, if a thermal oxidation step is performed before the trenches 41 is filled with the insulating layer 42 by a TEOS-CVD apparatus or the like, an insulating film with good film quality can be formed. When the insulating layer 42 is embedded after this process, better electrical insulating regions can be obtained.

When an insulating film is to be formed by using Si—B—O-based glass as an insulating material, a fine Si—B—O-based glass fine powder 42' is deposited on the starting substrate 40 by an FHD (Flame Hydrolysis Deposition) method (see International Symposium on Power Semiconductor Devices "APPLICATION OF DIELECTRIC ISOLATION TECHNOLOGY BASED ON SOOT BONDING" R. Swada, H. Nakada NTT Applied Electronics Laboratories), and sintered, thereby obtaining the insulating film, as indicated by the chain double-dashed line in FIG. 6B. In this sintering process, the fine powder 42' (soot produced by hydrolyzing the fine powder 42' with flames) may be sprayed first on the surface of the starting substrate 40, and the resultant film may be sintered then. Assume that the fine powder 42' is not formed thick. In this case, when this film is sintered in the next annealing process, the deposit decreases in thickness. As a result, the trenches may not be satisfactorily filled with the film. For this reason, the fine glass power 42' is formed into a thick film, as indicated by the chain double-dashed line. The thickness of this film decreases after annealing, as indicated by the solid line in FIG. 6B. For example, the Si—B—O-based glass material used in this case consists of 34 to 42 wt % of Si, 10 to 5 wt % of B, and 56 to 53 wt % of O. This material has a softening point of 1,400° C. and 1.6 and a linear expansion coefficient of 1.6 to 2.3×10$^{-6}$ [K$^{-1}$].

If a silicon substrate and Si—B—O-based glass or the like having a small thermal expansion coefficient difference are used as a substrate material and an insulating material, respectively, thermal stress can be suppressed in the manufacturing process to prevent destruction of the substrate. This allows a process in a wider temperature range than the case in which an oxide or nitride film is used, thereby expanding the range of applications.

Figure 7A:
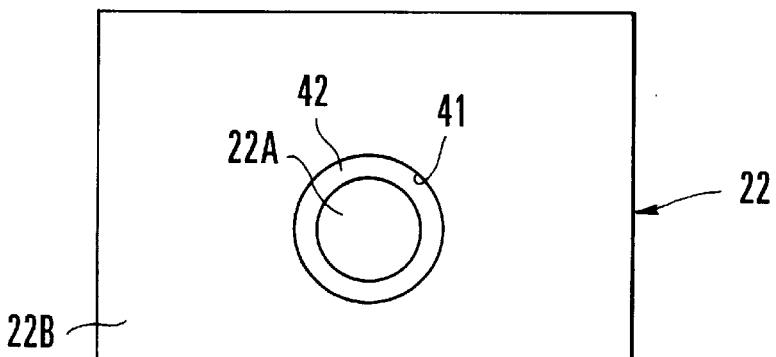
Figure 7B:
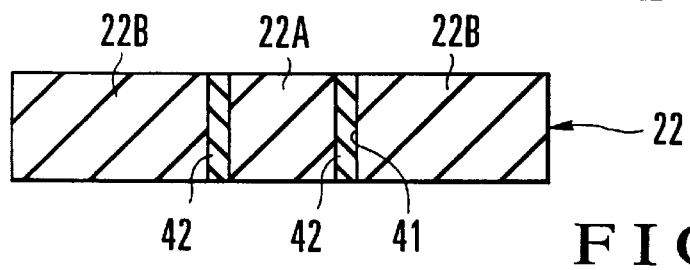

As shown in FIGS. 7A and 7B, the upper and lower surfaces of the starting substrate 40 are polished to obtain the circuit substrate 22 having the final thickness. With this process, the insulating layer 42 formed in the above process is removed from the upper surface of the substrate, and the lower end of each trench 41 is exposed on the upper surface side. As a result, the circuit substrate 22 is perfectly and electrically insulated and separated into two regions in the planar direction, i.e., a first region 22A surrounded by the insulating layer 42 in the trench 41 and a second region 22B outside the insulating layer 42. This circuit substrate 22 is made up of the substrate material and the insulating layer 42 as an oxide film of the substrate material, and hence contains no metal or the like which tends to become a cause of contamination.

Figure 8A:
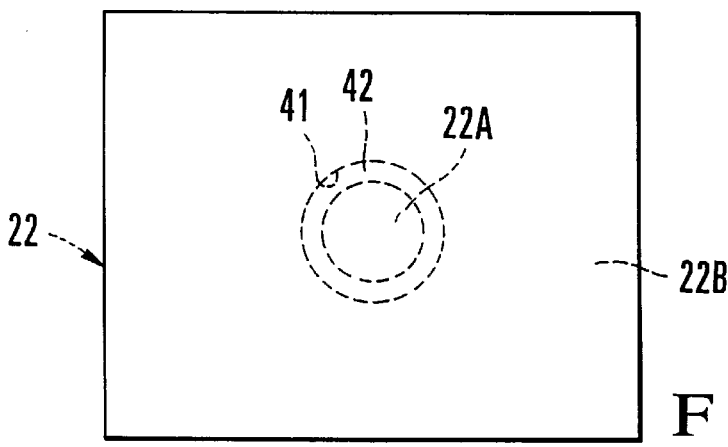
Figure 8B:
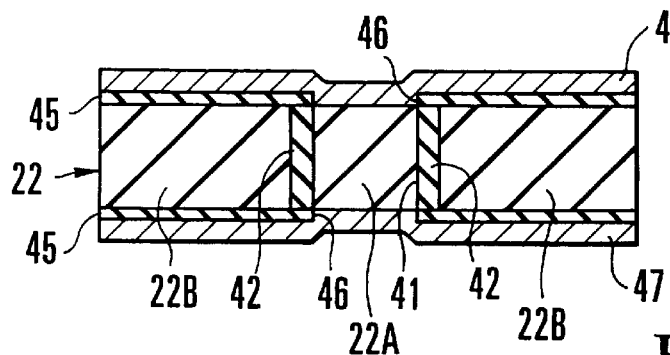

The conductivity of the first region 22A surrounded by the insulating layer 42 is increased to form an electrode. This electrode formation process is performed by diffusion of an impurity. In this diffusion process, as shown in FIGS. 8A and 8B, insulating layers 45, each made of an oxide film, are formed on the upper and lower surfaces of the circuit substrate 22 to mask the substrate. A portion, of the insulating layer 45, which covers the first region 22A is removed to form a diffusion window 46. Diffusion films 47 as diffusion sources are then formed on the upper and lower surfaces of the circuit substrate 22. For example, these diffusion films 47 are made of Al. The diffusion films 47 are annealed to diffuse the impurity into the first region 22A. As a result, the impurity concentration of the first region 22A becomes higher than that of the second region 22B. In other words, the conductivity of the first region 22A increases, and the region serves as an electrode.

Figure 9A:
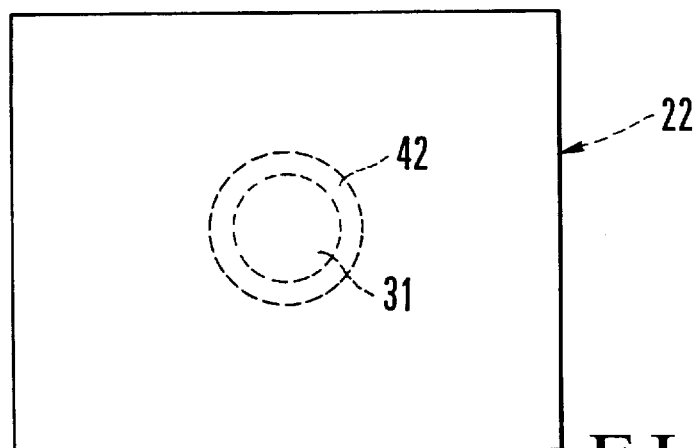
Figure 9B:
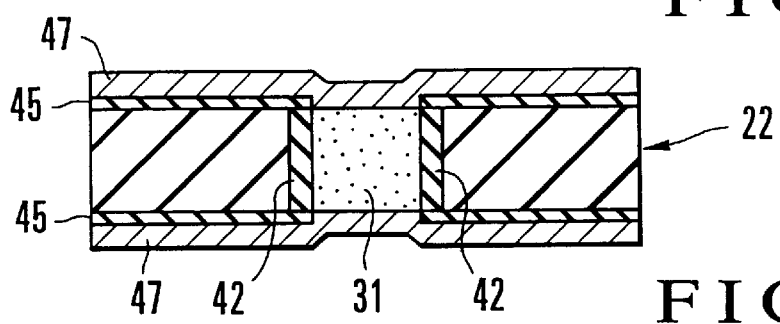

FIGS. 9A and 9B show a state in which the electrode 31 is formed by impurity diffusion. In this case, solids are used as diffusion sources for diffusion. Obviously, however, the present invention is not limited to this, and diffusion may be performed by using a vapor or liquid phase.

Figure 10A:
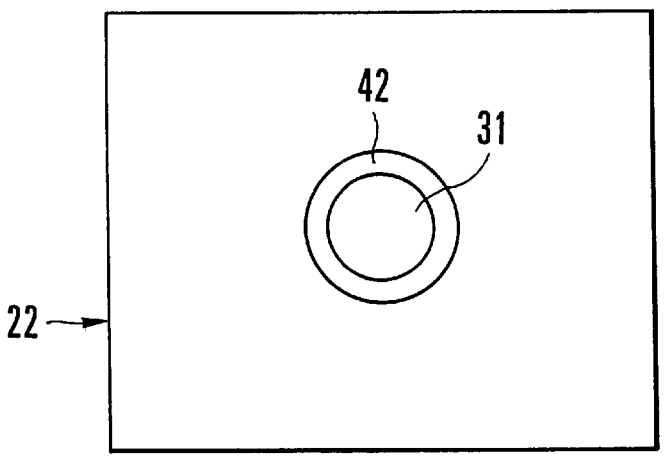
Figure 10B:
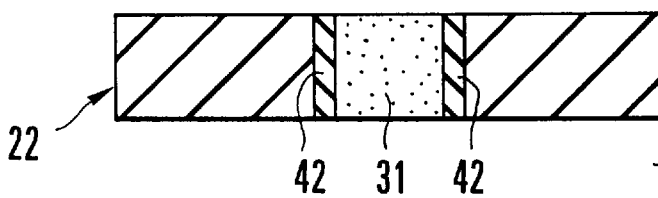

Finally, the unnecessary diffusion films 47 are removed from the upper and lower surfaces of the circuit substrate 22 by polishing or the like to finish the electrode 31 (FIGS. 10A and 10B).

A sensor is formed as follows. The insulating layers 24 (see FIG. 4) are formed on the upper and lower surfaces of the substrate. Thereafter, the temperature-measuring resistors 28A and 28B, the heater 29, the fluid temperature detecting resistor 30, the thin metal contact film 32, and the lower-surface electrode pad 35, and the like, which constitute the detecting section 27, are formed on the insulating layer 24. These components are then covered with the protective layer 37. The resultant structure is etched from the upper surface side to form the diaphragm 25, thus finishing the flow rate sensor 20.

According to the flow rate sensor of this embodiment, when a detector section is formed on the above circuit substrate and used as a flow rate detector, since electrodes can be connected from the lower surface side, the upper surface can be made flat. This prevents a turbulent fluid flow, thus allowing stable, high-precision measurement.

Second Embodiment

A circuit substrate according to another embodiment of the present invention will be described next.

FIGS. 11A and 11B are plan and sectional views showing a semiconductor substrate and an electrode according to another embodiment.

In this embodiment, a plurality of insulating layers 42, each having a small cylindrical shape, are formed to separate a circuit substrate 22 into three electrically insulated/isolated regions in the planar direction, i.e., a first region 22A surrounded by the overall insulating layers 42, a second region 22B located outside the overall insulating layers 42, and a plurality of third regions 22C surrounded by the insulating layers 42. An impurity is diffused into only the first region 22A to form an electrode 31. Each insulating layer 42 is made of an oxide film of the circuit substrate 22. An insulator is embedded into the third region 22C surrounded by the insulating layers 42. The insulating layers 42 and the insulator (third region 22C) surrounded by each insulating layer 42 form an electrical insulating region of the circuit substrate according to this embodiment. Note that the second region 22B is made of the substrate material without diffusion of any impurity.

FIGS. 12A to 19B are views for explaining a method of manufacturing the circuit substrate shown in FIGS. 11A and 11B.

First of all, the circuit substrate 22 having the final thickness is prepared. A plurality of small through holes 50 are concentrically formed in the circuit substrate 22 at small angular intervals (FIGS. 12A and 12B). The holes 50 can be formed by using a low-temperature Si dry etching apparatus or the like in the same manner as the formation of the trenches 41 in the above embodiment.

Substrate material portions 51 between the respective adjacent holes 50 constitute a support portion for supporting the first region 22A serving as an electrode. The space between the adjacent holes 50 must be set to be smaller than the space by which the substrate material can be separated into the three electrically insulated/isolated regions, as shown in FIGS. 11A and 11B, i.e., the first region 22A, the second region 22B, and the third region 22C, when the circuit substrate 22 is oxidized to grow oxide films afterward. More specifically, this space is set to 10 μm or less. In addition, each hole 50 is not limited to a round shape. Each hole can have any shape as long as the respective holes are mechanically connected to each other through only narrow portions each having a size of 10 μm or less.

Figure 13A:
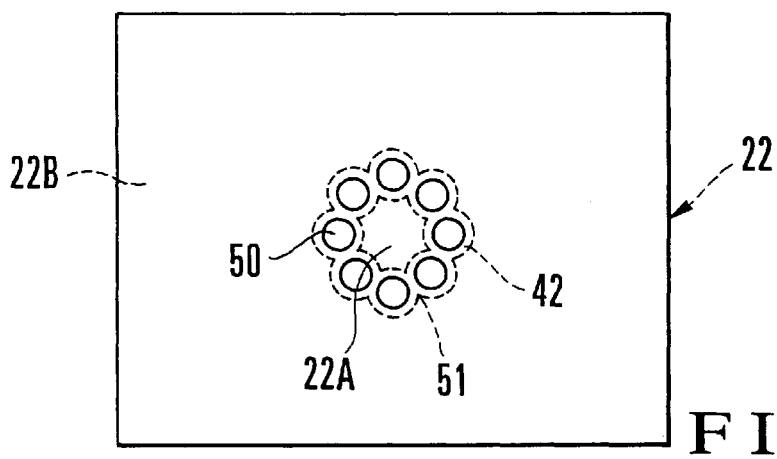
Figure 13B:
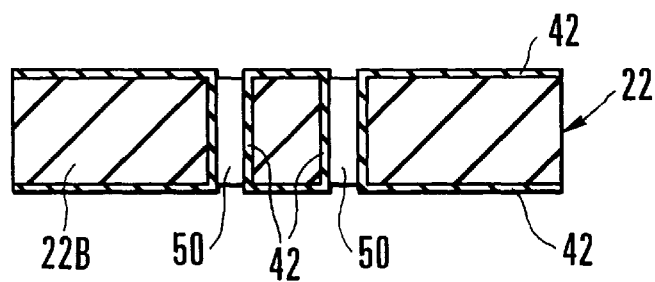

The circuit substrate 22 is then thermally oxidized to form the insulating layers 42, each made of a thermal oxide film, on the upper and lower surfaces of the substrate and the inner wall of each hole 50 (FIGS. 13A and 13B). This insulating layer 42 is continuous on the substrate material portion 51 between the adjacent holes 50. Each hole 50 is then filled with an insulator 52 (see FIGS. 14A and 14B). With this process, the circuit substrate 22 is separated into three electrically insulated/isolated regions, i.e., the first region 22A, the second region 22B, and the third region 22C. The insulating layers 42 covering the upper and lower surfaces of the circuit substrate 22 are removed by polishing or the like. In this case, the insulating layers 42 are formed of the thermal oxide films. However, the present invention is not limited to this. A nitride film formed by nitriding reaction or the like may be used as an insulating film.

Figure 14A:
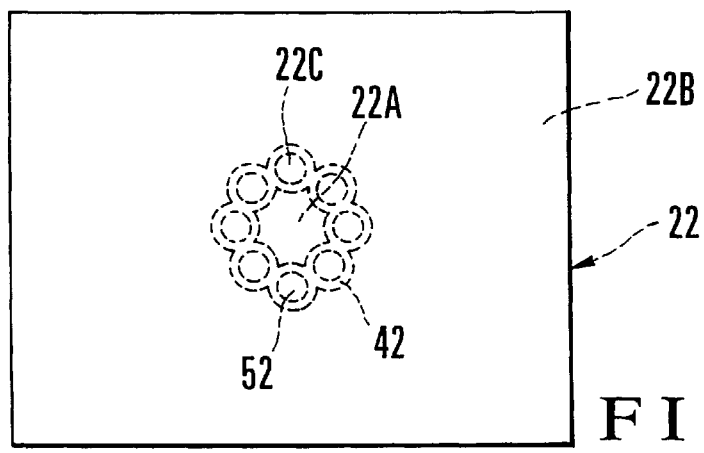
Figure 14B:
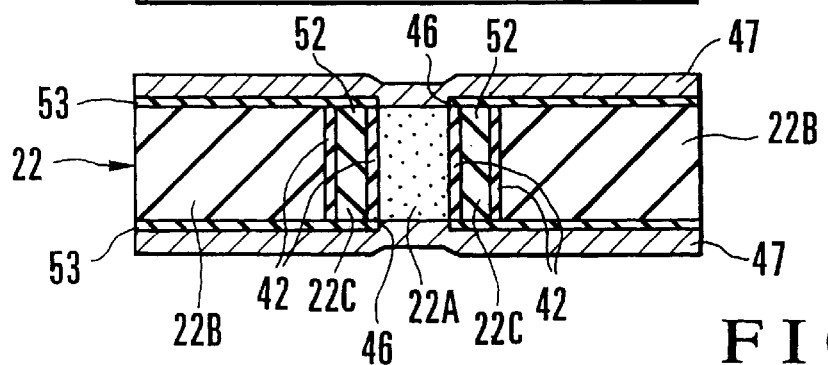

As shown in FIGS. 14A and 14B, the upper and lower surfaces of the circuit substrate 22 are covered with a masking material 53, and a portion, of the masking material 53, which corresponds to the first region 22A is removed to form a diffusion window 46. Thereafter, diffusion films 47 serving as diffusion sources are formed on the entire upper and lower surfaces of the circuit substrate 22. The impurity in the diffusion films 47 is diffused into the first region 22A by annealing. As a result, the impurity concentration of the first region 22A becomes higher than that of the second region 22B.

Figure 15A:
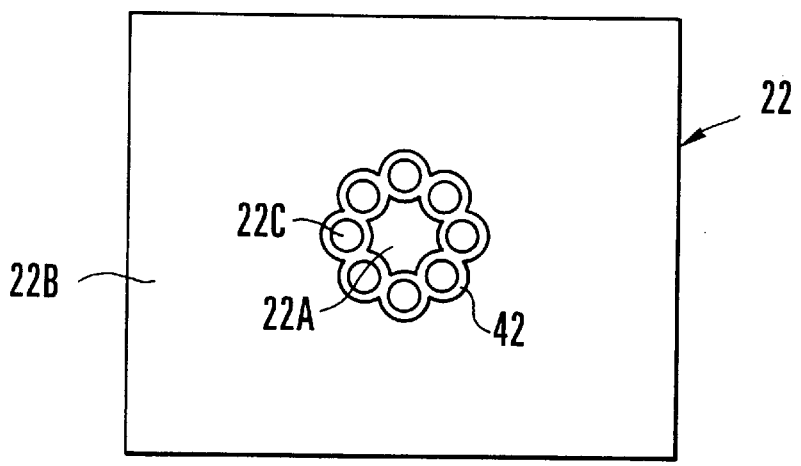
Figure 15B:
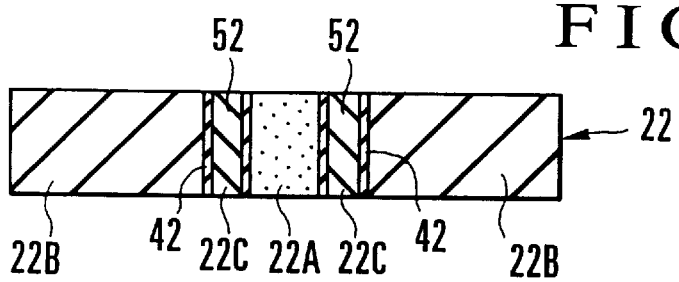

After this process, the unnecessary diffusion films 47 are removed from the upper and lower surfaces of the circuit substrate 22 to expose the first region 22A, into which the impurity has been diffused, on the upper and lower surfaces of the circuit substrate 22, as shown in FIG. 15B. As a result, the first region 22A serves as an electrode, and can be extracted from the lower surface side of the substrate.

Third Embodiment

Figure 16A:
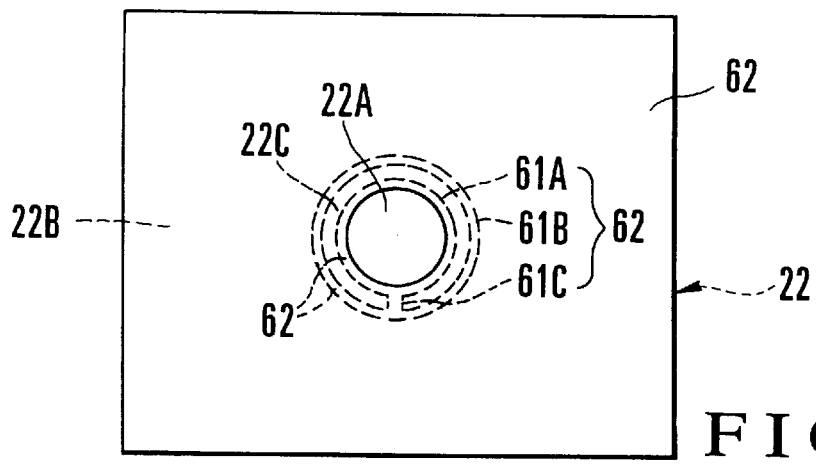
FIGS. 16A to 17B are views for explaining a method of manufacturing a circuit substrate and electrode according to the third embodiment of the present invention (in which FIGS. 16A and 17A are plan views, and FIGS. 16B and 17B are sectional views)
Figure 16B:
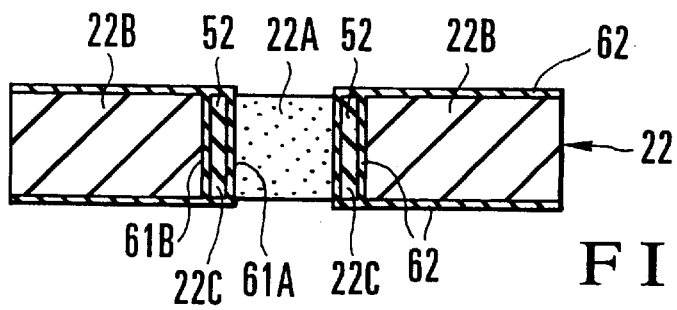

FIGS. 16A and 16B are plan and sectional views showing a circuit substrate according to the third embodiment of the present invention.

In this embodiment, a circuit substrate 22 is separated into three electrically insulated/isolated regions in the planar direction by an insulating layer 62 constituted by two cylindrical portions 61A and 61B which are concentrically formed and have different diameters and a connecting portion 61C for connecting the cylindrical portions 61A and 61B. The three regions are a first region 22A surrounded by the inner cylindrical portion 61A, a second region 22B located outside the outer cylindrical portion 61B, and a third region 22C surrounded by the two cylindrical portions 61A and 61B. The conductivity of only the first region 22A is increased by diffusing an impurity to make the region serve as an electrode. The third region 22C surrounded by the first and second cylindrical portions 61A and 61B is filled with an insulator 52.

Figure 17A:
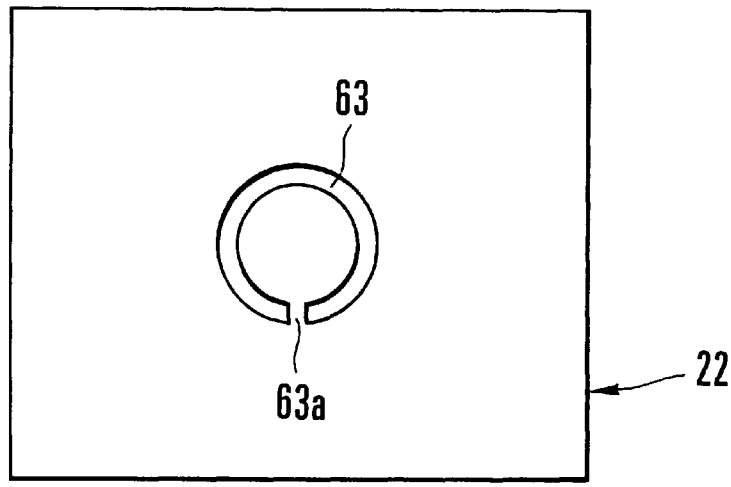
Figure 17B:
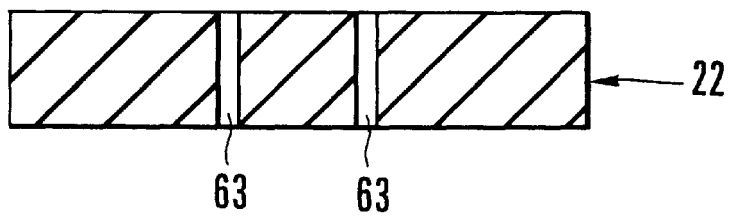

The insulating layer 62 may be formed as follows. As shown in FIGS. 17A and 17B, a C-shaped annular hole 63 is formed as a through hole in the circuit substrate 22 such that a portion of the circumferential surface is notched/opened. The insulating layer 62 is then formed on the wall of the annular hole 63. The width of a notched opening 63a (connecting portion 61C) of the annular hole 63 is set to be smaller than the space by which the substrate material can be separated into the first region 22A, the second region 22B, and the third region 22C which are perfectly and electrically insulated and isolated from each other, as in the case of the space 51 between the adjacent holes 50 in FIGS. 12A and 12B. With this arrangement, the insulating layer 62 and this insulator 52 (third region 22C) form an electrical insulating region of the circuit substrate of this embodiment.

The step of filling the third region 22C with an insulator, the step of forming the first region 22A into an electrode, and the like are the same as those in the above embodiment.

Fourth Embodiment

Figure 18:
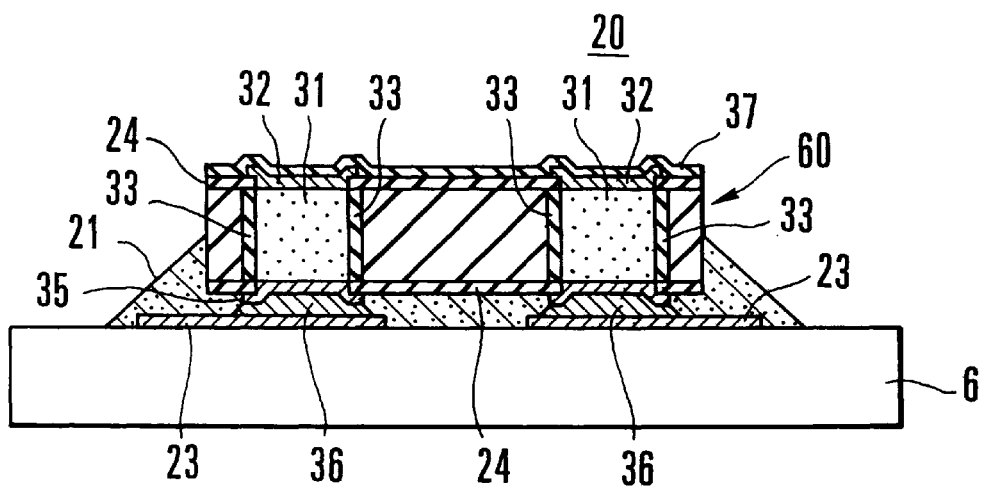
FIG. 18 is a sectional view showing a detector according to the fourth embodiment of the present invention.

FIG. 18 is a sectional view showing a sensor according to the fourth embodiment of the present invention.

This embodiment differs from the above embodiment in that a substrate material having high conductivity is used for a circuit substrate 60 in place of the semiconductor substrate having low conductivity. As the substrate material, a silicon substrate having high conductivity is used. Electrical insulating regions 33 which continuously extend from the upper surface to the lower surface of the substrate and are closed in the planar direction are formed to separate the circuit substrate 60 into a plurality of conductive regions electrically insulated from each other in the planar direction. Each conductive region surrounded by the insulating region 33 serves as an electrode 31. A thin metal contact film 32 and a lower-surface electrode pad 35 are respectively connected to the upper and lower surfaces of the electrode 31. The insulating region 33 is made of a heat-resistant insulating material such as $Al_2O_3$, $SiO_2$, or $SiN_x$. This insulating region 33 may be formed by forming a trench in the circuit substrate 60 and filling the trench with an insulating material for the insulating region 33 as in the above embodiment. After the insulating region 33 is formed, the circuit substrate 60 is thinned by polishing or the like such that the trench appears on the upper and lower surfaces of the circuit substrate 60, thereby exposing the two ends of the insulating region 33 on the upper and lower surfaces of the substrate. The thin metal contact film 32 and the lower-surface electrode pad 35 are respectively mounted on the upper and lower surfaces of the region surrounded by the insulating region 33, i.e., the electrode 31. The upper and lower surfaces of a substrate portion outside the insulating region 33 are covered with insulating layers 24, and the entire upper surface of the substrate is covered with a protective layer 37. In this case, no diaphragm is formed. With this arrangement as well, the electrodes 31 can be easily formed and can also be extracted from the lower surface side of the circuit substrate 60 as in the above embodiment.

Fifth Embodiment

The fifth embodiment of the present invention will be described next.

Since a sensor according to this embodiment has the same outer appearance as that of the flow rate sensor in FIG. 2, a description of the arrangement of the sensor will be omitted.

FIG. 19 is a sectional view taken along a line III—III in FIG. 2. FIG. 20 is an enlarged sectional view taken along a line IV—IV in FIG. 2.

Each electrode 31 is formed to continuously extend from the upper surface to the lower surface of the substrate in the thickness direction of a circuit substrate 22. The electrode 31 is surrounded by insulating layers 42 as an electrical insulating region to be electrically insulated and isolated from the substrate material outside the insulating layers 42. This electrode 31 can be easily formed by diffusing an impurity into the region surrounded by the insulating layers 42. With this diffusion of the impurity, the impurity concentration of the region becomes higher than that of the outer region surrounding the insulating layers 42. As a result, this region has conductivity. As a diffusion source for diffusion, Al or the like is used.

This embodiment differs from the above embodiments in the structure of an insulating isolation region for insulating/isolating the electrode 31.

More specifically, the insulating layers 42 forming an electrical insulating region sandwich a polysilicon layer 43 to form a laminated structure.

In this case, when an oxide film is to be formed to form an insulating region in the silicon substrate, a film formation method such as TEOS-CVD (Chemical Vapor Deposition) with a high film formation rate can be used. Assume that the film formation rate is about 0.3 $\mu$m/min and the width of an opening portion is about 30 $\mu$m. In this case, theoretically, the opening portion can be filled with the film in about 50 min. In this case, however, the thermal expansion coefficient of silicon is about 3 ppm/C, and the thermal expansion coefficient of the oxide film is about 0.3 ppm, which is $\frac{1}{10}$ the thermal expansion coefficient of silicon. This large thermal expansion coefficient mismatch produces stress on the electrode portion when the wafer undergoes a high-temperature process, and may destroy the substrate in the worst case.

Assume that a nitride film is to be formed in the silicon substrate. In this case, the thermal expansion coefficient of the nitride film is relatively close to the thermal expansion coefficient of silicon. In general, however, no nitride silicon film formation means having a high film formation rate has been established, and hence it takes much time to fill a trench having an opening portion having a size of about 20 to 30 $\mu$m, which is required in the present invention.

In this embodiment, since the insulating layers 42 forming an electrical insulating region sandwich the polysilicon layer 43 to have a laminated structure, the difference between the thermal expansion coefficient of the substrate material and that of the insulating region is very small, both matching of the electrical insulating properties and that of the thermal expansion coefficients can be attained at the same time. Since the difference between the thermal expansion coefficient of the circuit substrate 22 and that of the insulating region decreases, less thermal stress is produced in the manufacturing process. This prevents warpage, destruction, and the like of the substrate due to thermal stress in a high-temperature process. In addition, this allows a process in a wider temperature range than the case in which an oxide or nitride film is used, thereby expanding the range of applications.

In this embodiment, the above insulating layer 42 is formed into a cylindrical shape by using a heat-resistant insulating material, e.g., a reaction product produced when a substrate material reacts, and more specifically, an oxide ($SiO_2$) or nitride ($Si_3N_4$) of a substrate material, an $SiN_x$—, $Al_2O_3$—, or Si—B—O-based glass material, or the like. The two ends of the insulating layer 42 are exposed on the upper and lower surfaces of the substrate to completely surround the electrode 31 to electrically insulate it from the substrate material outside the insulating layer 42.

As will be described later, this insulating layer 42 can be easily formed by forming a through hole or trench in the circuit substrate 22, forming an oxide or nitride film on the wall, and forming the polysilicon layer 43 on the wall.

When a trench is to be formed, it suffices if an electrical insulating region having a laminated structure in which the polysilicon layer 43 is sandwiched between the insulating layers 42 formed on the wall of the trench is formed, and the substrate is thinned by polishing or the like to make the trench appear on the upper and lower surfaces of the substrate so as to expose the two ends of each insulating layer 42 on the upper and lower surfaces of the substrate.

The thin metal contact film 32 and the lower-surface electrode pad 35 are respectively connected to the upper and lower surfaces of the electrode 31, i.e., the surfaces exposed on the upper and lower surfaces of the circuit substrate 22. The lower-surface electrode pad 35 is electrically and mechanically connected to the mount-board electrodes 23, which is formed on the mount board 6, with a solder 36. The entire upper surface of the circuit substrate 22 is covered with a protective layer 37 for preventing electrolytic corrosion of each electrode portion by improving its environment resistance.

When the ratio of the sum of the thicknesses of the insulating layers 42 to the thickness of the polysilicon layer 43 was set to 0.2 or less, the present inventor found that the inconvenience due to thermal stress could be eliminated, as indicated by Table 1 below.

TABLE 1

| Sum of Thicknesses of Insulating Layers/thickness of Polysilicon Layer | Warpage of 5-inch Silicon Substrate |
|---|---|
| 0.2 or less | Every substrate had a warpage of 100 $\mu$m or less |
| more than 0.2 | Some substrates had warpage of 100 $\mu$m or more |

A method of manufacturing the above circuit substrate 22 and each electrode 31 will be described in detail next.

FIGS. 21A to 27B are plan and sectional views showing the first method of manufacturing the circuit substrates and the electrodes.

Figure 21A:
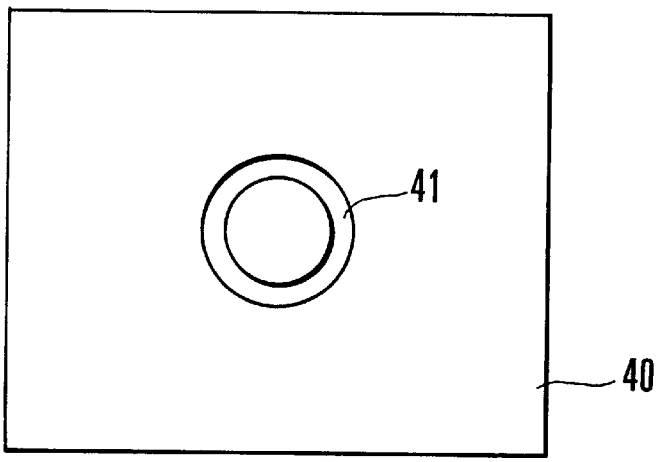
Figure 21B:
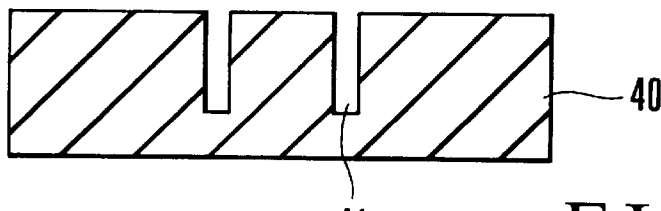

First of all, a semiconductor substrate thicker than the circuit substrate 22 is prepared as a starting substrate 40. Prospective electrode formation portions of the starting substrate 40 are etched to form cylindrical trenches 41. The starting substrate 40 preferably has a thickness enough to maintain sufficient mechanical strength upon formation of the trenches 41. The depth of each trench 41 is set to be slightly larger than the thickness of the finished circuit substrate 22. In addition, the trenches 41 need not be vertical. Since a monocrystalline silicon substrate is used as a substrate material, substantially vertical trenches 41 can be formed, as shown in FIG. 21B, by using a low-temperature Si dry etching apparatus or the like. In this case, since the aspect ratio of a cross-section of the trench 41 can be set to about 20:1, when a 500-$\mu$m deep trench is to be formed, a trench having a width of at least 25 $\mu$m needs to be formed.

Figure 22A:
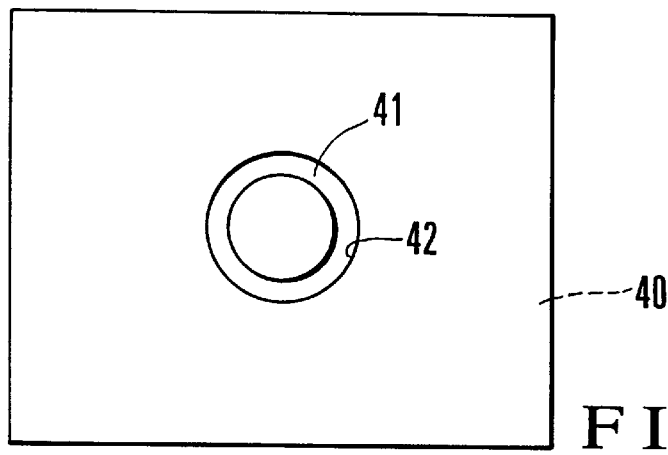
Figure 22B:
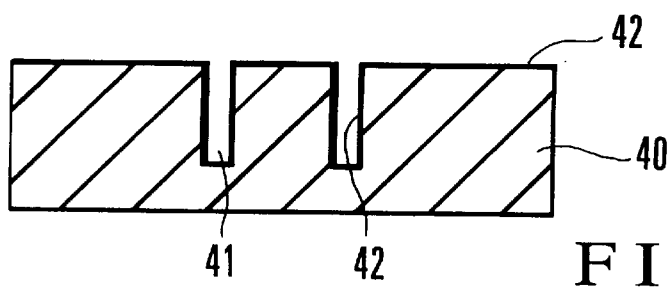

An insulating layer 42 made of $SiO_2$ is formed on the surface of the starting substrate 40 and the trench walls of the trenches 41 (FIGS. 22A and 22B). The insulating layer 42 can be formed by using an apparatus having the property of satisfactorily spreading a film on the entire surface of the substrate at a high film formation rate, e.g., a TEOS-CVD (Chemical Vapor Deposition) apparatus. If the substrate is made of Si, an insulating film having better film quality can be formed by performing a thermal oxidation process instead of forming the insulating layer 42 on the wall of each trench 41. As this insulating film, an oxide film formed by low-pressure CVD may be used.

A polysilicon layer 43 is formed on the wall of the trench 41, surrounded by the insulating layer 42, by a low-pressure CVD apparatus (FIGS. 23A and 23B). The polysilicon layer 43 may be formed as follows. The starting substrate 40 on which the insulating layer 42 is formed is placed in a reaction gas containing Si and kept in an evacuated state. An Si crystal is then grown on the substrate surface by using a chemical reaction. The crystal grown in this case is polycrystalline.

As shown in FIGS. 24A and 24B, the upper and lower surfaces of the starting substrate 40 are polished to obtain the circuit substrate 22 having the final thickness. With this process, the insulating layer 42 formed in the above process is removed from the upper surface of the substrate, and the lower end of each trench 41 is exposed on the upper surface side. As a result, the circuit substrate 22 is perfectly and electrically insulated and separated into two regions in the planar direction, i.e., a first region 22A surrounded by the insulating layer 42 in the trench 41 and a second region 22B outside the insulating layer 42. This circuit substrate 22 is made up of the substrate material and the insulating layer 42 as an oxide film of the substrate material, and hence contains no metal or the like which tends to become a cause of contamination.

The conductivity of the first region 22A surrounded by the insulating layer 42 is increased to form an electrode. This electrode formation process is performed by diffusion of an impurity. In this diffusion process, as shown in FIGS. 25A and 25B, insulating layers 45, each made of an oxide film, are formed on the upper and lower surfaces of the circuit substrate 22 to mask the substrate. A portion, of the insulating layer 45, which covers the first region 22A is removed to form a diffusion window 46. Diffusion films 47 as diffusion sources are then formed on the upper and lower surfaces of the circuit substrate 22. For example, these diffusion films 47 are made of Al. The diffusion films 47 are annealed to diffuse the impurity into the first region 22A. As a result, the impurity concentration of the first region 22A becomes higher than that of the second region 22B. In other words, the conductivity of the first region 22A increases, and the region serves as an electrode.

FIGS. 26A and 26B show a state in which the electrode 31 is formed by impurity diffusion. In this case, solids are used as diffusion sources for diffusion. Obviously, however, the present invention is not limited to this, and diffusion may be performed by using a vapor or liquid phase.

The unnecessary diffusion films 47 are then removed from the upper and lower surfaces of the circuit substrate 22 by polishing or the like to finish the electrode 31 (FIGS. 27A and 27B). The insulating layers 24 (see FIG. 20) are formed on the upper and lower surfaces of the substrate. Thereafter, temperature-measuring resistors 28A and 28B, a heater 29, a fluid temperature detecting resistor 30, a thin metal contact film 32, a lower-surface electrode pad 35, and the like, which constitute the detecting section 27, are formed on the insulating layers 24. These components are then covered with the protective layer 37. The resultant structure is etched from the upper surface side to form a diaphragm 25, thus finishing a flow rate sensor 20.

Sixth Embodiment

Figure 28A:
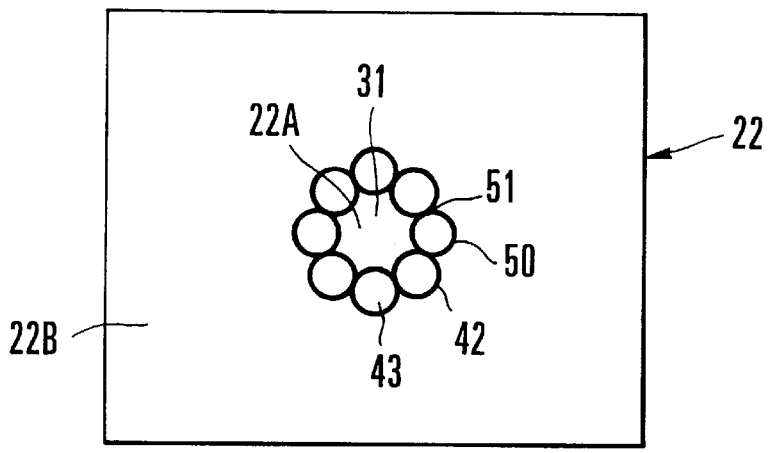
FIGS. 28A and 28B are views for explaining a method of manufacturing a circuit substrate and electrode according to the sixth embodiment of the present invention (in which FIG. 28A is a plan view, and FIG. 28B is a sectional view)
Figure 28B:
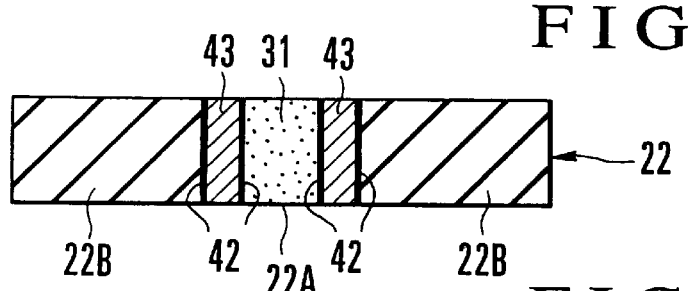

FIG. 28A is a plan view showing a semiconductor substrate and an electrode according to the sixth embodiment of the present invention. FIG. 28B is a sectional view of the semiconductor substrate.

In this embodiment, a circuit substrate 22 is separated into two electric ally insulated and isolated regions in the planar direction by a plurality of insulating layers 42 each having a small cylindrical shape. More specifically, the two regions are a first region 22A surrounded by the plurality of insulating layers 42 and a second region 22B outside the insulating layers 42. Only the first region 22A is formed into an electrode 31 by diffusing an impurity. The insulating layers 42 surround a polysilicon layer 43 to form a laminated structure as in the above embodiment.

The electrode 31 is manufactured as follows. First of all, the circuit substrate 22 having the final thickness is prepared. A plurality of small through holes 50 are concentrically formed in the circuit substrate 22 at small angular intervals. The holes 50 can be formed by using a low-temperature Si dry etching apparatus or the like in the same manner as the formation of the trenches 41 in the above embodiment. Substrate material portions 51 between the respective adjacent holes 50 constitute a support portion for supporting the first region 22A serving as an electrode. The space between the adjacent holes 50 must be set to be smaller than the space by which the substrate material can be separated into the first and second electrically insulated/isolated regions 22A and 22B when the circuit substrate 22 is oxidized to grow oxide films afterward. More specifically, this space is set to 10 $\mu$m or less. In addition, each hole 50 is not limited to a round shape. Each hole can have any shape as long as the respective holes are mechanically connected to each other through only narrow portions each having a size of 10 $\mu$m or less.

The circuit substrate 22 is th en thermally oxidized to form the insulating layers 42, each made of a thermal oxide film, on the upper and lower surfaces of the substrate and the inner wall of each hole 50. This insulating layer 42 is continuous on the substrate material portion 51 between the adjacent holes 50. The polysilicon layers 43 are formed on the walls of the holes 50 by a low-pressure CVD apparatus to cover the insulating layers 42. The polysilicon layers 43 in the respective holes 50 are independent of each other.

Diffusion films as diffusion sources are formed on the entire upper and lower surfaces of the circuit substrate 22. The impurity is diffused into the first region 22A by annealing. As a result, the impurity concentration of the first region 22A becomes higher than that of the second region 22B.

After this process, the unnecessary diffusion films are removed from the upper and lower surfaces of the circuit substrate 22 to expose the first region 22A, into which the impurity has been diffused, on the upper and lower surfaces of the circuit substrate 22, as shown in FIGS. 28A and 28B. As a result, the first region 22A serves as an electrode, and can be extracted from the lower surface side of the substrate.

Seventh Embodiment

Figure 29A:
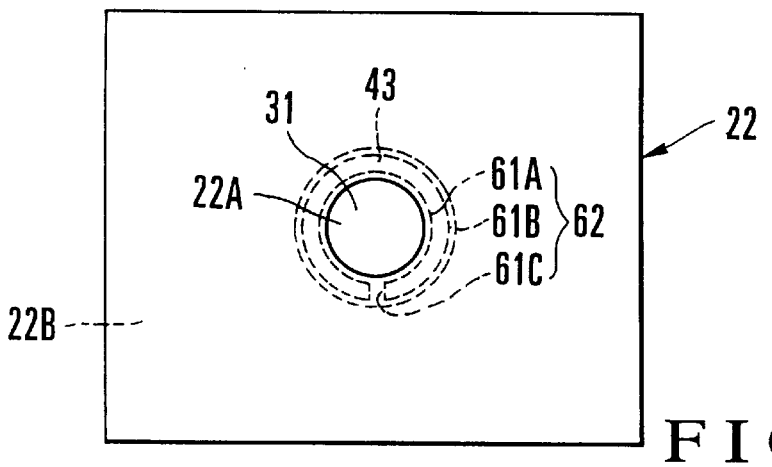
FIGS. 29A and 29B are views for explaining a method of manufacturing a circuit substrate and electrode according to the sixth embodiment of the present invention (in which FIG. 29A is a plan view, and FIG. 29B is a sectional view)
Figure 29B:
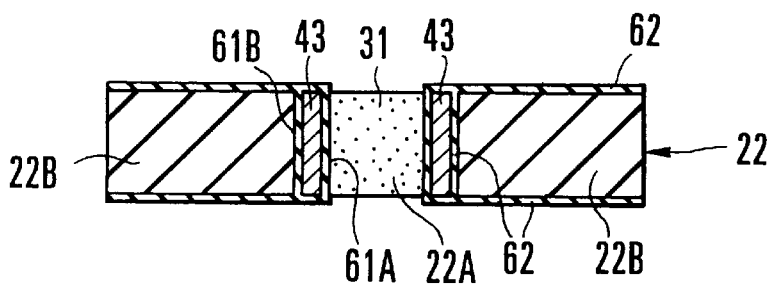

FIG. 29A is a plan view showing a circuit substrate and an electrode according to the seventh embodiment of the present invention. FIG. 29B is a sectional view.

In this embodiment, a circuit substrate 22 is separated into two electrically insulated/isolated regions in the planar direction by an insulating layer 62 constituted by two cylindrical portions 61A and 61B which are concentrically formed and have different diameters and a connecting portion 61C for connecting the cylindrical portions 61A and 61B. More specifically, the circuit substrate 22 is separated into a first region 22A surrounded by the outer cylindrical portion 61B and a second region 22B outside the outer cylindrical portion 61B, thereby forming an electrode 31. The insulating layer 62 is sandwiched between polysilicon layers 43 to form a laminated structure.

The insulating layer 62 and the electrode 31 are formed in the same manner as in the above embodiment. In the manufacturing process, a C-shaped annular hole is formed as a through hole in the circuit substrate 22 such that a portion of the circumferential surface is notched/opened. The insulating layer 62 may be then formed on the wall of the annular hole, and the polysilicon layer 43 may be formed in the trench. The width of a notched opening of the annular hole is set to be smaller than the space by which the substrate material can be separated into the first and second electrically insulated/isolated regions 22A and 22B, as in the case of the substrate material portion 51 between the adjacent holes 50 in FIGS. 28A and 28B.

Eighth Embodiment

Figure 30:
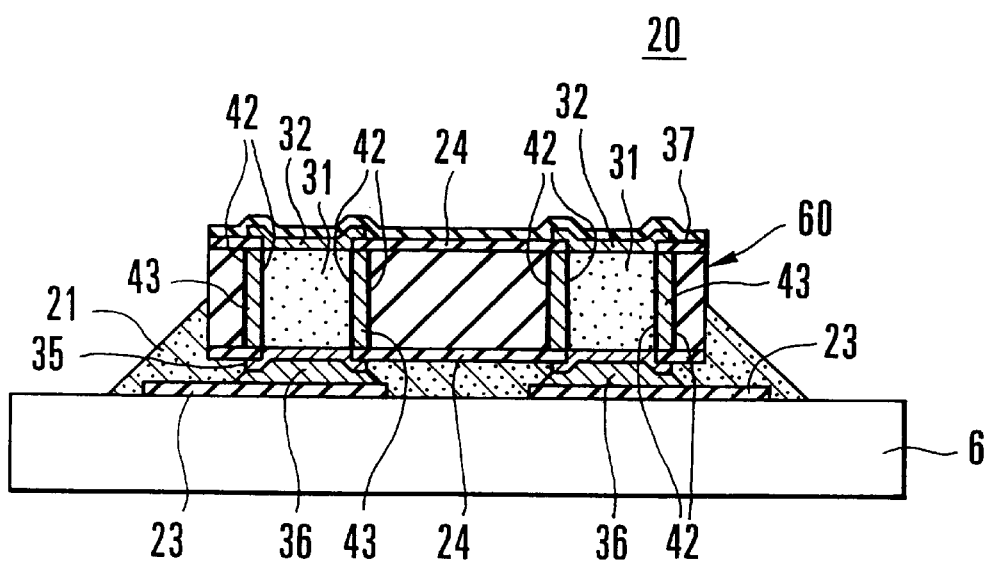
FIG. 30 is a sectional view showing a detector according to the eighth embodiment of the present invention.

FIG. 30 is a sectional view showing a detector according to the eighth embodiment of the present invention.

This embodiment differs from the above embodiment in that a high-conductivity substrate material in which boron, phosphorus, or the like is diffused in advance is used for a circuit substrate 60 instead of a low-conductivity semiconductor substrate. As the substrate material, a silicon substrate having high conductivity is used. Insulating layers 42 as electrical insulating regions which continuously extend from the upper surface to the lower surface of the substrate and are closed in the planar direction are formed to separate the circuit substrate 60 into a plurality of conductive regions electrically insulated and isolated from each other in the planar direction. Each conductive region surrounded by the insulating layers 33 serves as an electrode 31. A thin metal contact film 32 and a lower-surface electrode pad 35 are respectively connected to the upper and lower surfaces of the electrode 31. The insulating layers 33 are made of a heat-resistant insulating material such as $Al_2O_3$, $SiO_2$, or $SiN_x$ and sandwich a polysilicon layer 43 to form a laminated structure. The insulating layers 42 may be formed by forming a trench in the circuit substrate 60 as in the above embodiment and coating the trench with an insulating material. The polysilicon film 43 is then formed. After the insulating layers 42 are formed, the circuit substrate 60 is thinned by polishing or the like such that the trench appears on the upper and lower surfaces of the circuit substrate 60, thereby exposing the two ends of each insulating layer 42 on the upper and lower surfaces of the substrate. The thin metal contact film 32 and the lower-surface electrode pad 35 are respectively mounted on the upper and lower surfaces of the region surrounded by the insulating layers 42, i.e., the electrode 31. The upper and lower surfaces of a substrate portion outside the insulating layers 42 are covered with insulating layers 24, and the entire upper surface of the substrate is covered with a protective layer 37. In this case, no diaphragm is formed.

With this arrangement as well, the electrodes 31 can be easily formed and can also be extracted from the lower surface side of the circuit substrate 60 as in the above embodiment.

In this embodiment, since the electrode 31 is formed before the diaphragm is formed, problems such as destruction of a membrane can be prevented.

In each embodiment described above, the present invention is applied to the detector for detecting the flow rate of a fluid. However, the present invention is not limited to this, and can be applied to various types of detectors.

Ninth Embodiment

In some of the embodiments described above, the electrical insulating region that separates the substrate into the first insulated/isolated region forming the lower-surface electrode and the second insulated/isolated region is formed by embedding an insulator such as glass in the substrate. The ninth embodiment of the present invention to be described below has an impurity diffusion suppression film between an insulator such as glass that forms an electrical insulating region and the first and second region of a substrate. This impurity diffusion suppression film includes an oxide film including a thermal oxide film, or a nitride film.

The circuit substrate manufacturing method according to the ninth embodiment of the present invention will be described with reference to FIGS. 31A to 32B by exemplifying the method of forming a trench in a starting substrate made of monocrystalline silicon and forming an electrical insulating layer by embedding glass in the trench.

Figure 31A:
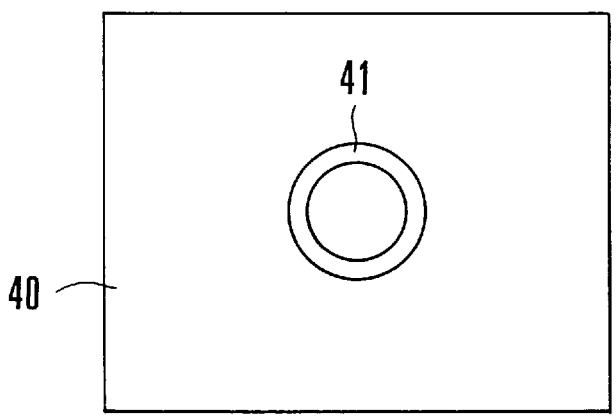
FIGS. 31A to 32B are plan views (FIGS. 31A and 32A) and sectional views (FIGS. 31B and 32B) showing the ninth embodiment of the present invention.
Figure 31B:
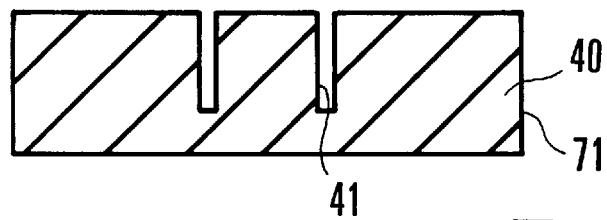

First of all, a semiconductor substrate 40 made of monocrystalline silicon thicker than a circuit substrate is prepared as a starting substrate 40. A cylindrical trench 41 is formed by etching a prospective insulating region formation portion on the surface of the starting substrate 40, as shown in FIGS. 31A and 31B. The substantially vertical trench 41 can be formed by using a low-temperature Si dry etching apparatus, as shown in FIG. 31B. In this case, the starting substrate 40 preferably has a thickness enough to maintain sufficient mechanical strength upon formation of the trench 41. The depth of the trench 41 is set to be slightly larger than the thickness of a finished circuit substrate 22.

An impurity diffusion suppression film 71 made of $SiO_2$ is formed on the upper surface of the starting substrate 40 and the wall of the trench 41 (FIG. 31B). An apparatus having the property of satisfactorily spreading a film at a high film formation rate, e.g., a TEOS-CVD (Chemical Vapor Deposition) apparatus can also be used to form this impurity diffusion suppression film 71. In addition, since the monocrystalline silicon is used for the substrate, an insulating film having better film quality can be formed by performing a thermal oxidation step. As this impurity diffusion suppression film 71, an oxide film or nitride film formed by low-pressure CVD may be used instead of the thermal oxide film.

Figure 32A:
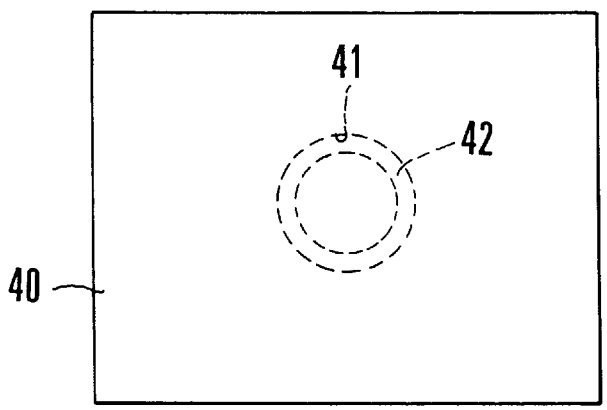
Figure 32B:
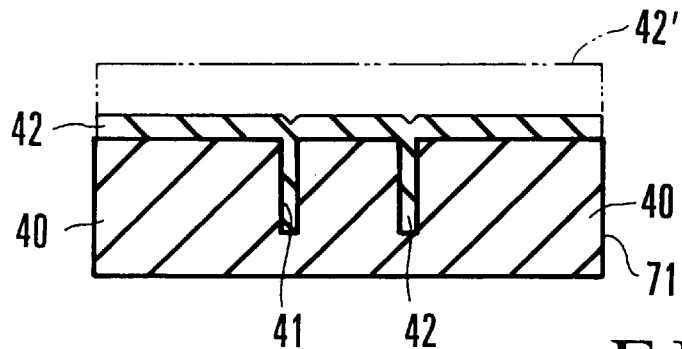

Subsequently, as indicated by the chain double-dashed line in FIG. 32B, a fine Si—B—O-based glass fine powder 42' is deposited on the starting substrate 40 by the FHD method and sintered to form an insulating layer 42 serving as an electrical insulating region. In this sintering process, soot produced by hydrolyzing the fine powder 42' with flames is sprayed first on the surface of the starting substrate 40, and the resultant film is then sintered. For example, the Si—B—O-based glass material consists of 34 to 42 wt % of Si, 10 to 5 wt % of B, and 56 to 53 wt % of O. This material has a softening point of 1,4000 and a linear expansion coefficient of 1.6 to $2.3 \times 10^{-6}$ [$K^{-1}$].

In forming the fine powder 42' into a film, if the film has not sufficient thickness, the trench may not be satisfactorily filled with the film because the deposit decreases in thickness in the next annealing process. For this reason, the fine glass power 42' is formed into a thick film, as indicated by the chain double-dashed line. Then, the film has the thickness indicated by the solid line in FIG. 6B after annealing.

After the Si—B—O-based glass is embedded in this manner, the upper and lower surfaces of the starting substrate 40 are polished to obtain the circuit substrate 22 having the final thickness. With this process, the impurity diffusion suppression film 71 and the insulating layer 42 formed in the above process are removed from the upper surface of the substrate, and the lower end of the trench 41 is exposed on the lower surface side. As a result, the circuit substrate 22 is perfectly and electrically insulated and separated into two regions in the planar direction, i.e., a first region 22A surrounded by the insulating layer 42 in the trench 41 and a second region 22B located outside the insulating layer 42.

An impurity is diffused into only the first region 22A surrounded by the insulating layer 42 to increase the conductivity and form the region into an electrode. Since this electrode formation process is the same as in the remaining embodiments describe above, a description thereof will be omitted.

Since the circuit substrate 22 according to this embodiment has the impurity diffusion suppression film 71 formed between the insulating layer 42 made of glass or the like and the starting substrate 40, diffusion of the impurity from the insulating layer 42 into the substrate can be suppressed. Since the impurity diffusion suppression film 71 is formed on the inner wall of the trench 41 and the upper surface of the starting substrate 40 before the insulating layer 42 is formed, in particular, even if the substrate is subjected to a high-temperature annealing process in forming the insulating layer 42, diffusion of the impurity contained in the above glass into the substrate can be suppressed. Assume that the insulating layer 42 is formed by using Si—B—O-based glass, as described above. Even in this case, since the diffusion rate of B (boron) in the silicon oxide film is very low, even if annealing is performed at 1,200° C. for a few hours, diffusion of the impurity can be suppressed as long as an oxide film having a thickness of about 100 nm is formed as an impurity diffusion suppression film.

Suppression of impurity diffusion from glass as an insulating material in this manner can solve, for example, the problems that the impurity diffused in the silicon substrate causes an excessive decrease in anisotropic etching rate, and an IC cannot be formed because of high impurity concentration in the substrate.

10th Embodiment

A circuit substrate using having different impurity concentrations in the thickness direction of the circuit substrate will be described next as the 10th embodiment of the present invention with reference to FIGS. 33 to 36.

In this embodiment, a silicon epitaxial wafer is used as a starting substrate.

Figure 33A:
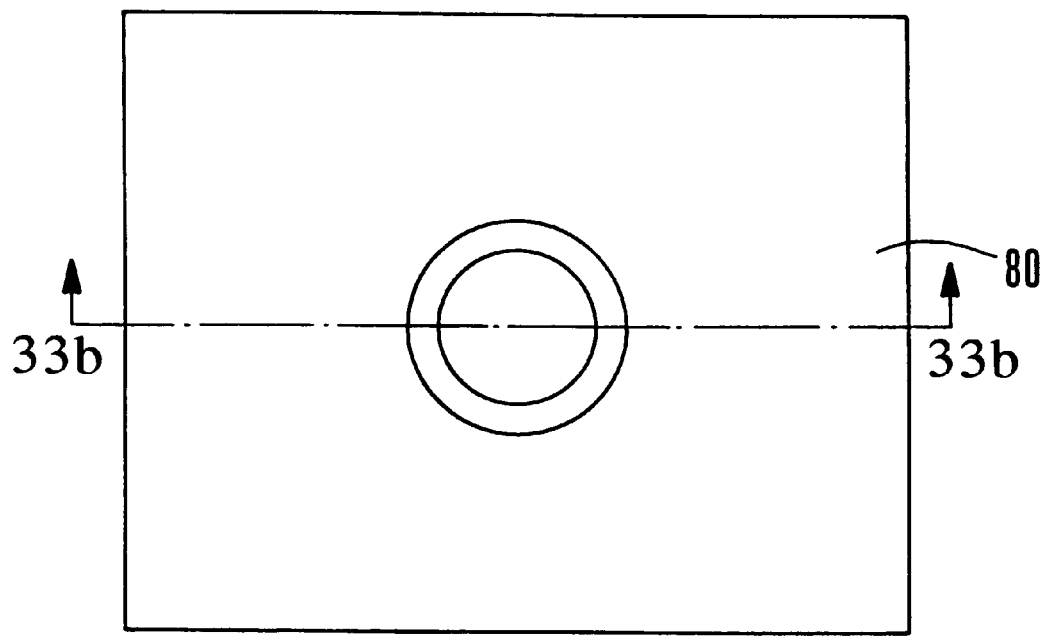
Figure 33B:
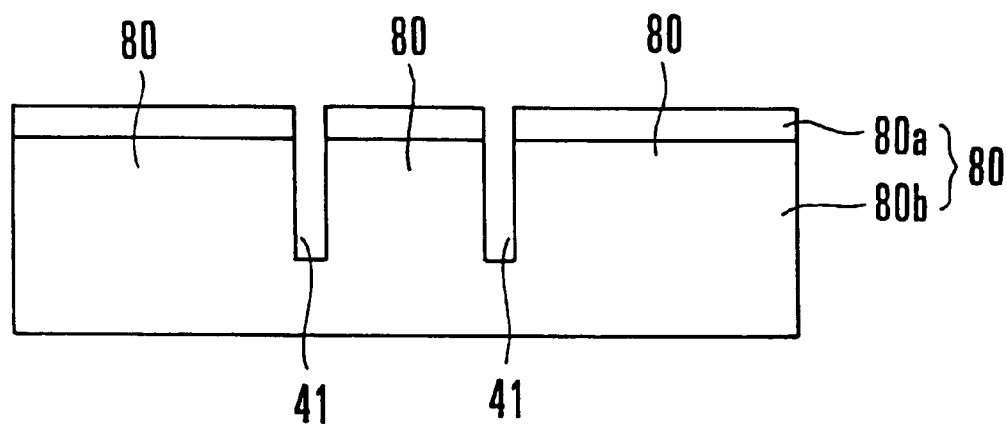

As shown in FIG. 33, a silicon epitaxial wafer 80 is formed by growing an epitaxial layer 80a on an epitaxial substrate 80b.

In this case, the impurity concentration of the epitaxial wafer 80 changes in the thickness direction. The resistivity of the epitaxial layer 80a is 1 Ωcm, whereas the resistivity of the epitaxial substrate 80b is 0.002 Ωcm, which is lower than that of the epitaxial layer 80a.

In this embodiment, the conductivity type of the epitaxial layer 80a is the same as that of the epitaxial substrate 80b. Assume that they differ in their conductivity types. In this case, a PN junction is formed on the junction surface between the epitaxial layer 80a and the epitaxial substrate 80b. As a result, when a lower-surface extraction electrode is formed, as will be described later, ohmic contact or electric connection cannot be obtained.

In this embodiment as well, a lower-surface electrode is formed as follows. As in the embodiment described above (first embodiment), a trench 41 is formed in the epitaxial wafer 80 from the epitaxial layer 80a side by etching (FIG. 33), and an insulating layer 42 is embedded in the trench 41 by a TEOS-CVD apparatus or the like (FIG. 34). Thereafter, the epitaxial wafer 80 is polished from the epitaxial substrate 80b side to expose the two ends of the insulating layer 42 on the upper and lower surfaces of the epitaxial wafer 80, thereby forming a first insulated/isolated region 801 surrounded by the insulating layer 42 and a second insulated/isolated region 802 located outside the insulating layer 42 (FIG. 35). The first region 801 surrounded by the insulating layer 42 can be used as a lower-surface extraction electrode.

In this case, the epitaxial layer 80a and the epitaxial substrate 80b respectively have thicknesses of 5 μm and 500 μm.

As a result, when the first region 801 on the upper surface of the epitaxial wafer 80 has an area of 0.01 mm² (corresponding to an area 0.1 by 0.1 mm square), the lower-surface extraction electrode made of the first region 801 has a resistance of 1Ω in the epitaxial layer 80a and a resistance of 5Ω in the epitaxial substrate 80b, i.e., a total resistance of 6Ω.

This embodiment uses the method of forming the insulating layer 42 serving as an insulating region by forming the trench 41. Instead of using this method, however, the embodiment may use the method of forming a plurality of insulating layers in small cylindrical shapes as in the second embodiment, or the method of forming an insulating layer by concentrically forming two cylindrical portions having different diameters as in the third embodiment.

In addition, as is obvious from the description of the fifth to seventh embodiments, the insulating layer 42 that forms the electrical insulating regions may have a laminated structure in which a polysilicon layer 43 is sandwiched.

FIG. 36 is a view showing a case wherein an insulating layer 81 and an interconnection pattern 82 are formed on the upper surface of the circuit substrate according to this embodiment, and an electrode pad 83 is formed on the lower surface. The interconnection pattern 82 is electrically connected to the electrode pad 83 through the lower-surface extraction electrode (first region 801).

By using an epitaxial wafer having an epitaxial substrate with such a low resistivity, the resistance of the lower-surface extraction electrode can be suppressed low. Therefore, the problems of an increase in cost and contamination, which arise when an impurity is diffused into the first region 801 in the thickness direction at a high concentration, can be prevented.

Although the substrate formed to have conductivity by forming the overall substrate using a substrate material having a low resistivity can solve the problem of the resistance of the lower-surface extraction electrode, no IC can be formed on the substrate. The circuit substrate according to this embodiment, however, allows a circuit such as an IC to be formed on the epitaxial layer 80*a* having a relatively high resistance on the upper surface of the epitaxial wafer.

The resistance of the lower-surface extraction electrode may be decreased by decreasing the thickness of the epitaxial layer 80*a*. Obviously, however, an impurity may be diffused into the first region 801 from the epitaxial layer 80*a* side. In this case, it suffices if an impurity having the same conductivity type is diffused into only the thin epitaxial layer 80*a*. For this reason, the time required for impurity diffusion is much shorter than that required to diffuse an impurity deep in the thickness direction of the substrate, and hence an increase in cost can be suppressed.

A conductivity type can be selected for the epitaxial layer 80*a* by diffusing an impurity into the epitaxial layer 80*a* of the first region 801. In this case, since the epitaxial layer 80*a* can be made to have the same conductivity type as that of the epitaxial substrate 80*b* by impurity diffusion, the epitaxial layer 80*a* and the epitaxial substrate 80*b* constituting the epitaxial wafer 80 need not always have the same conductivity type. That is, the present invention can be applied to a substrate having a PN junction in the thickness direction. This extends the range of choices of substrates. If a circuit substrate according to the present invention is formed from a substrate having such a PN junction, the electric field etching stop technique, which is used to form a diaphragm such as a pressure sensor, can be applied.

11th Embodiment

A circuit substrate using an SOI (Silicon On Insulator) wafer will be described next as the 11th embodiment of the present invention with reference to FIGS. 37 to 41B.

Figure 37A:
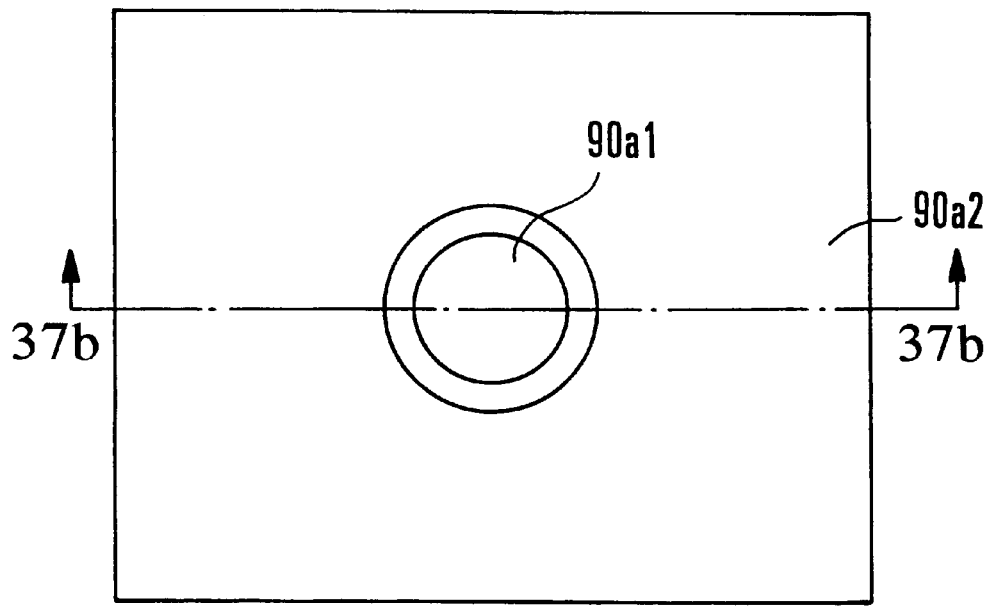
Figure 37B:
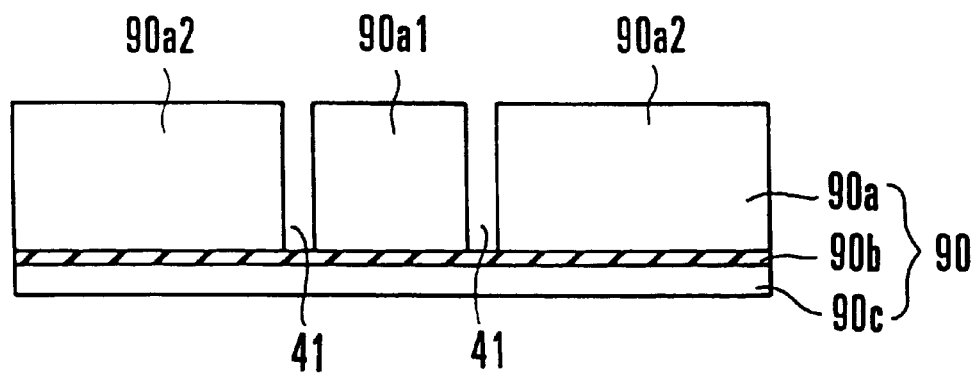
Figure 42A:
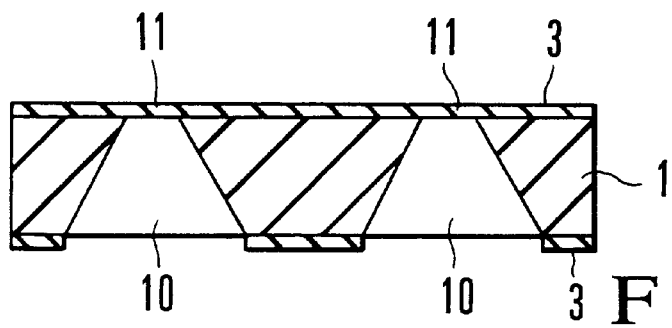
Figure 42B:
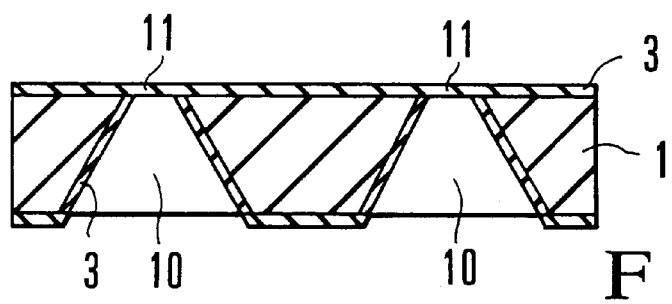
Figure 42C:
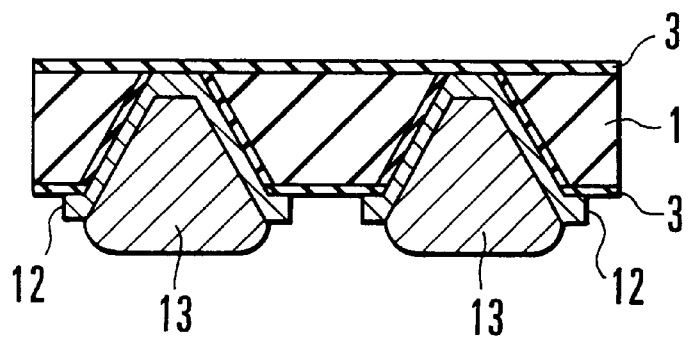
Figure 42D:
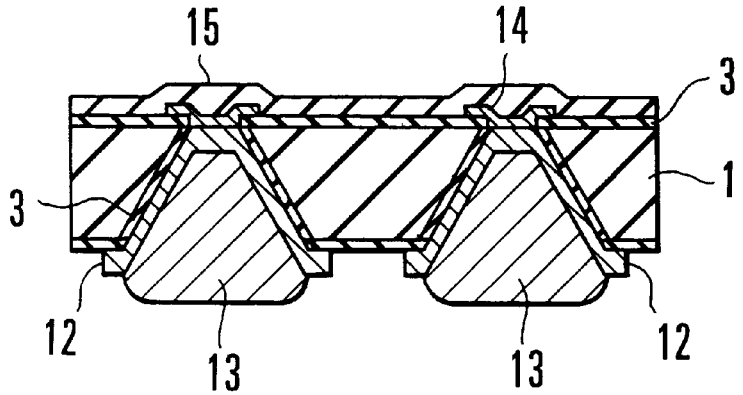
Figure 43A:
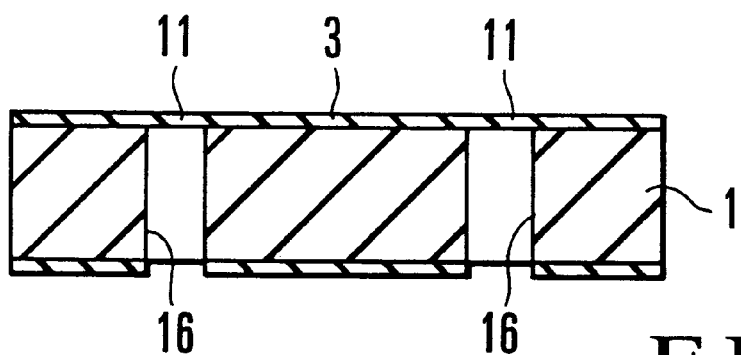
Figure 43B:
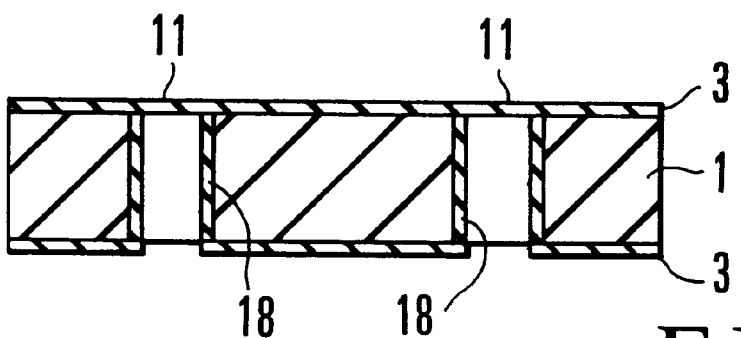
Figure 43C:
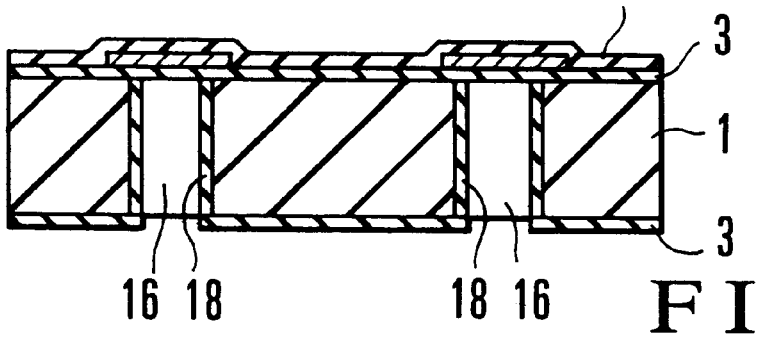
Figure 43D:
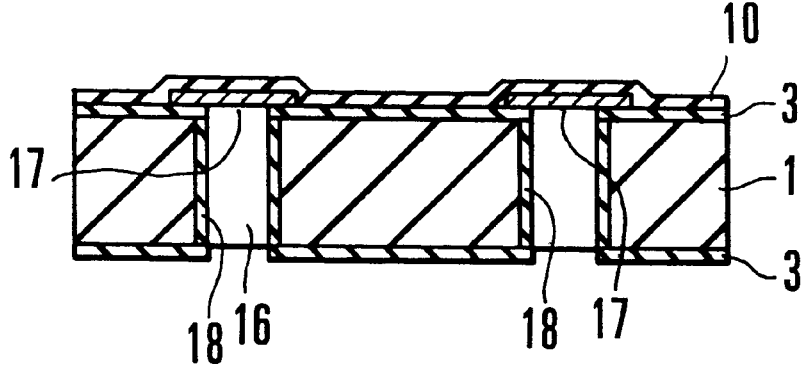

As shown in FIG. 37, an SOI wafer 90 used in this embodiment is made up of two semiconductor layers, i.e., an SOI base wafer 90*a* and an SOI active layer 90*c*, and an oxide layer 90*b* formed between the two semiconductor layers. In this case, the SOI base wafer 90*a* has a high impurity concentration. Note that the SOI base wafer 90*a* and the SOI active layer 90*c* may have the same conductivity type or opposite conductivity types.

In this embodiment, first of all, trench etching of the silicon is performed from the SOI base wafer 90*a* side by using a silicon deep etcher to form a trench 41 that continuously extends from the upper surface of the SOI base wafer 90*a* to the lower surface of the oxide layer 90*b* and is closed in a plane parallel to the surface of the SOI substrate (FIG. 37). In this case, since the selectivity in etching the silicon and the oxide film is as high as 200:1, the above trench etching for the formation of the trench 41 can be stopped at the oxide layer 90*b*.

Subsequently, an insulating layer 42 is embedded in the trench 41 by using a TEOS-CVD apparatus or the like to form an insulating region (FIG. 38). As a result, the SOI base wafer 90*a* is separated into first insulated/isolated region 90*a*1 surrounded by the insulating layer 42 and a second insulated/isolated region 90*a*2 located outside the insulating layer 42. As will be described later, the first region 90*a*1 surrounded by the insulating layer 42 is used as a lower-surface extraction electrode.

The insulating layer 42 formed on the SOI base wafer 90*a* is then removed by polishing the SOI base wafer 90*a* of the SOI wafer 90. As a result, the insulating layer 42 embedded in the trench 41 is exposed on the upper surface of the SOI base wafer 90*a* (FIG. 39).

A necessary IC is formed in the SOI active layer 90*c* of the SOI wafer 90 after this process (FIG. 40).

Before the final interconnection pattern is formed, a contact hole is formed in the SOI active layer 90*c* and the oxide layer 90*b* in correspondence with the first region 90*a*1 (lower-surface extraction electrode) surrounded by the insulating layer 42 forming the insulating region. In the process of forming this contact hole, a predetermined place of the SOI active layer 90*c* is etched by anisotropic etching or the like to expose the oxide layer 90*b*. A portion of the oxide layer 90*b* which corresponds to the lower-surface extraction electrode is selectively removed by wet or dry etching. Thereafter, insulating layers 91 are formed on the upper and lower surfaces of the SOI wafer 90, and a contact hole is formed. Finally, as shown in FIG. 41, an electrode pad 92 is formed in the contact hole located on the SOI base wafer 90*a* side of the SOI wafer 90, and an interconnection pattern 93 is formed on the SOI active layer 90*c* side, thereby obtaining a circuit substrate using the SOI wafer 90 having the lower-surface extraction electrode.

If the mechanical strength of the SOI active layer 90*c* is not sufficient in performing trench etching on the SOI base wafer 90*a*, an SOI wafer having the SOI active layer 90*c* whose thickness is larger than that required finally may be used. After filling the trench 41 with the insulating layer 42 such as glass, the SOI active layer may be polished to adjust its thickness. By polishing the surface of the SOI active layer 90*c* in this manner, high cleanliness can be ensured for the surface in which an IC is to be formed.

The insulating layer 42 as the electrical insulating region may be formed by using the method of forming a plurality of insulating layers in small cylindrical shapes or the method of forming an insulating layer by concentrically forming two cylindrical portions having different diameters, as in the second or third embodiment described above.

As is obvious from the description of the to seventh embodiments, the insulating layer 42 that forms the electrical insulating regions may have a laminated structure in which a polysilicon layer 43 is sandwiched.

According to the circuit substrate of this embodiment, since the oxide layer 90*b* is present between the SOI base wafer 90*a* having a high impurity concentration and the SOI active layer 90*c* having a low impurity concentration, diffusion of an impurity between the two layers in annealing for the substrate can be prevented.

In addition, if the resistivity of the SOI active layer 90*c* is increased, an IC can be formed in this layer.

Furthermore, since no impurity needs to be diffused into the first region 90*a*1 serving as the lower-surface extraction electrode, no impurity diffusion step is required. Therefore, reductions in the number of manufacturing steps and cost can be attained.

What is claimed is:

1. A circuit substrate manufacturing method characterized by comprising the steps of:

forming, on a semiconductor substrate, an electrical insulating region which is made of a heat-resistant insulating material, continuously extends from an upper surface to a lower surface of said semiconductor substrate, and is closed in a plane parallel to the surface of said semiconductor substrate, and separating said semiconductor substrate into first and second electrically insulated/isolated regions, said first region being surrounded by said electrical insulating region and said second region being outside said electrical insulating region wherein said first region and said second region are formed from the same semiconductor substrate and diffusing an impurity into said first region, of said semiconductor substrate, which is surrounded by said electrical insulating region to make said first region have conductivity.

2. A circuit substrate manufacturing method according to claim 1, characterized in that the step of separating said semiconductor substrate comprises the steps of:
   forming a trench in the surface of said semiconductor substrate such that the trench is closed in a plane parallel to the surface of said semiconductor substrate;
   forming an electrical insulating region by filling the trench with an insulating material; and
   polishing the lower surface of said semiconductor substrate up to the trench, and separating said semiconductor substrate into first and second electrically insulated/isolated regions, said first region being surrounded by said electrical insulating region, and said second region being outside said electrical insulating region.

3. A circuit substrate manufacturing method according to claim 1, characterized in that the step of separating said semiconductor substrate comprises the steps of:
   forming a through hole in said semiconductor substrate, and separating said semiconductor substrate into a first region surrounded by the through hole and a second region outside the through hole; and
   forming an electrical insulating region for electrically insulating and isolating said first and second regions by filling the through hole with an insulating material.

4. A circuit substrate manufacturing method according to claim 1, characterized in that a silicon substrate is used as said semiconductor substrate, and glass is used as the heat-resistant insulating material.

5. A circuit substrate manufacturing method according to claim 1, characterized in that a silicon substrate is used as said semiconductor substrate,
   the step of separating said semiconductor substrate into said insulated/isolated regions comprises the steps of:
   forming a trench in the upper surface of said semiconductor substrate, the trench being closed in a plane parallel to the surface of said semiconductor substrate;
   forming an impurity diffusion suppression film made of a silicon oxide film or nitride film on the upper surface of said semiconductor substrate including a side wall of the trench;
   forming an electrical insulating region by embedding glass in the trench whose side wall is covered with the impurity diffusion suppression film; and
   polishing said semiconductor substrate from at least the lower surface up to the trench, and separating said semiconductor substrate into first and second electrically insulated/isolated regions, said first region being surrounded by said electrical insulating region and said second region being outside said electrical insulating region.

6. A circuit substrate manufacturing method according to claim 2, characterized in that a silicon substrate is used as said semiconductor substrate, and the step of forming said electrical insulating region comprises the steps of:
   forming insulating layers on a wall of the trench; and
   forming a polysilicon layer in the trench having said insulating layers formed on the wall to form at least part of said electrical insulating region into a laminated structure in which said polysilicon layer is sandwiched between said insulating layers.

7. A circuit substrate manufacturing method according to claim 6, characterized in that said insulating layer is a silicon oxide film or silicon nitride film.

8. A circuit substrate manufacturing method according to claim 5, characterized in that a silicon substrate is used as said semiconductor substrate, and
   the step of forming said electrical insulating region comprises the steps of:
   forming an insulating layer on a wall of the through hole; and
   filling the through hole having the insulating layer formed on the wall with polysilicon.

9. A circuit substrate manufacturing method according to claim 8, characterized in that said insulating layer is a silicon oxide film or silicon nitride film.

10. A circuit substrate manufacturing method according to claim 1, characterized in that said semiconductor substrate has the same conductivity type and different impurity concentration distributions in a thickness direction, and
    the step of diffusing the impurity into said first region to make the first region have conductivity comprises diffusing an impurity having the same conductivity type into a portion of said first region which has a low impurity concentration.

11. A circuit substrate manufacturing method according to claim 1, characterized in that said semiconductor substrate has a PN junction in the thickness direction, and
    the step of diffusing the impurity into said first region to make the first region have conductivity comprises diffusing an impurity in a portion of said first region which has one conductivity type, the impurity having the other conductivity type, thereby making said first region have conductivity with said other conductivity type.

12. A circuit substrate manufacturing method characterized by comprising the steps of:
    forming an electrical insulating region in a semiconductor substrate having a PN junction in a thickness direction, having a high concentration of an impurity of one conductivity type, and having conductivity, said electrical insulating region being made of a heat-resistant insulating material, continuously extending from an upper surface to a lower surface of said semiconductor substrate, and being closed in a plane parallel to the surface of said semiconductor substrate, and separating said semiconductor substrate into first and second electrically insulated/isolated regions, said first region being surrounded by said electrical insulating region and said second region being outside said electrical insulating region; and
    removing a region, of said first region, which has the other conductivity type.

13. A circuit substrate manufacturing method characterized by comprising the steps of:
    forming an electrical insulating region in one semiconductor layer having conductivity and made up of two semiconductor layers and an oxide layer formed between said semiconductor layers, said one semiconductor layer having a high impurity concentration to have conductivity, and said electrical insulating region being made of a heat-resistant insulating material, continuously extending from an upper surface of said one semiconductor layer to said oxide layer, and being closed in a plane parallel to the surface of said semiconductor substrate; and
    forming a contact hole in said oxide layer and the other semiconductor layer of said substrate in correspondence with a first region of said one semiconductor layer.

* * * * *